(12) United States Patent
Tajalli

(10) Patent No.: US 10,277,431 B2
(45) Date of Patent: Apr. 30, 2019

(54) PHASE ROTATION CIRCUIT FOR EYE SCOPE MEASUREMENTS

(71) Applicant: Kandou Labs, S.A., Lausanne (CH)

(72) Inventor: Armin Tajalli, Chavannes près Renens (CH)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 15/603,404

(22) Filed: May 23, 2017

(65) Prior Publication Data
US 2018/0083638 A1 Mar. 22, 2018

Related U.S. Application Data

(60) Provisional application No. 62/395,993, filed on Sep. 16, 2016.

(51) Int. Cl.
*H04L 25/40* (2006.01)
*H03L 7/087* (2006.01)
(Continued)

(52) U.S. Cl.
CPC ............ *H04L 25/40* (2013.01); *H03K 19/21* (2013.01); *H03L 7/087* (2013.01); *H03L 7/0807* (2013.01); *H03L 7/0891* (2013.01); *H03L 7/0995* (2013.01); *H03L 7/0998* (2013.01); *H04L 7/0337* (2013.01); *H04L 25/0272* (2013.01); *H04L 25/14* (2013.01); *H03L 2207/06* (2013.01); *H04L 7/0025* (2013.01); *H04L 2203/02* (2013.01)

(58) Field of Classification Search
CPC .................... H04L 25/0292; H04L 25/03019; H04L 25/08
USPC ......................................................... 375/354
See application file for complete search history.

(56) References Cited

U.S. PATENT DOCUMENTS

| 668,687 | A | 2/1901 | Mayer |
| 780,883 | A | 1/1905 | Hinchman |

(Continued)

FOREIGN PATENT DOCUMENTS

| CN | 1864346 | 11/2006 |
| CN | 101478286 | 7/2009 |

(Continued)

OTHER PUBLICATIONS

Shibasaki, et al., "A 56-Gb/s Receiver Front-End with a CTLE and 1-Tap DFE in 20-nm CMOS", IEEE 2014 Symposium on VLSI Circuits Digest of Technical Papers, 2 pgs.

(Continued)

*Primary Examiner* — Leila Malek
(74) *Attorney, Agent, or Firm* — Invention Mine LLC

(57) ABSTRACT

Methods and systems are described for generating, with a local oscillator and an adjustable phase interpolator, a data-sampling clock and a variable-phase-offset eye-measurement clock, forming a received data signal using a multi-input comparator, generating, using a data slicer and the data sampling clock, a receive sample of the received data signal, and generating, using at least one eye slicer and the variable-phase-offset eye-measurement clock, a plurality of eye characteristic measurements by adjusting a sampling threshold of the at least one eye slicer and a phase offset of the variable-phase-offset eye-measurement clock.

20 Claims, 10 Drawing Sheets

(51) Int. Cl.
  *H04L 25/02* (2006.01)
  *H03K 19/21* (2006.01)
  *H03L 7/08* (2006.01)
  *H03L 7/089* (2006.01)
  *H03L 7/099* (2006.01)
  *H04L 7/033* (2006.01)
  *H04L 25/14* (2006.01)
  *H04L 7/00* (2006.01)

(56) References Cited

U.S. PATENT DOCUMENTS

| | | |
|---|---|---|
| 3,196,351 A | 7/1965 | Slepian |
| 3,636,463 A | 1/1972 | Ongkiehong |
| 3,939,468 A | 2/1976 | Mastin |
| 4,163,258 A | 7/1979 | Ebihara |
| 4,181,967 A | 1/1980 | Nash |
| 4,206,316 A | 6/1980 | Burnsweig |
| 4,276,543 A | 6/1981 | Miller |
| 4,414,512 A * | 11/1983 | Nelson ............... H03K 5/1532 327/100 |
| 4,486,739 A | 12/1984 | Franaszek |
| 4,499,550 A | 2/1985 | Ray |
| 4,722,084 A | 1/1988 | Morton |
| 4,772,845 A | 9/1988 | Scott |
| 4,774,498 A | 9/1988 | Traa |
| 4,864,303 A | 9/1989 | Ofek |
| 4,897,657 A | 1/1990 | Brubaker |
| 4,974,211 A | 11/1990 | Cori |
| 5,017,924 A | 5/1991 | Guiberteau |
| 5,053,974 A | 10/1991 | Penz |
| 5,166,956 A | 11/1992 | Baltus |
| 5,168,509 A | 12/1992 | Nakamura |
| 5,266,907 A | 11/1993 | Dacus |
| 5,283,761 A | 2/1994 | Gillingham |
| 5,287,305 A | 2/1994 | Yoshida |
| 5,311,516 A | 5/1994 | Kuznicki |
| 5,331,320 A | 7/1994 | Cideciyan |
| 5,412,689 A | 5/1995 | Chan |
| 5,449,895 A | 9/1995 | Hecht |
| 5,459,465 A | 10/1995 | Kagey |
| 5,461,379 A | 10/1995 | Weinman |
| 5,510,736 A | 4/1996 | Van De Plassche |
| 5,511,119 A | 4/1996 | Lechleider |
| 5,553,097 A | 9/1996 | Dagher |
| 5,566,193 A | 10/1996 | Cloonan |
| 5,599,550 A | 2/1997 | Kohlruss |
| 5,626,651 A | 5/1997 | Dullien |
| 5,629,651 A | 5/1997 | Mizuno |
| 5,659,353 A | 8/1997 | Kostreski |
| 5,727,006 A | 3/1998 | Dreyer |
| 5,748,948 A | 5/1998 | Yu |
| 5,802,356 A | 9/1998 | Gaskins |
| 5,825,808 A | 10/1998 | Hershey |
| 5,856,935 A | 1/1999 | Moy |
| 5,875,202 A | 2/1999 | Venters |
| 5,945,935 A | 8/1999 | Kusumoto |
| 5,949,060 A | 9/1999 | Schattschneider |
| 5,982,954 A | 11/1999 | Delen |
| 5,995,016 A | 11/1999 | Perino |
| 6,005,895 A | 12/1999 | Perino |
| 6,084,883 A | 7/2000 | Norrell |
| 6,119,263 A | 9/2000 | Mowbray |
| 6,172,634 B1 | 1/2001 | Leonowich |
| 6,175,230 B1 | 1/2001 | Hamblin |
| 6,232,908 B1 | 5/2001 | Nakaigawa |
| 6,278,740 B1 | 8/2001 | Nordyke |
| 6,316,987 B1 | 11/2001 | Dally |
| 6,346,907 B1 | 2/2002 | Dacy |
| 6,359,931 B1 | 3/2002 | Perino |
| 6,378,073 B1 | 4/2002 | Davis |
| 6,384,758 B1 | 5/2002 | Michalski |
| 6,398,359 B1 | 6/2002 | Silverbrook |
| 6,404,820 B1 | 6/2002 | Postol |
| 6,417,737 B1 | 7/2002 | Moloudi |
| 6,433,800 B1 | 8/2002 | Holtz |
| 6,452,420 B1 | 9/2002 | Wong |
| 6,473,877 B1 | 10/2002 | Sharma |
| 6,483,828 B1 | 11/2002 | Balachandran |
| 6,504,875 B2 | 1/2003 | Perino |
| 6,509,773 B2 | 1/2003 | Buchwald |
| 6,522,699 B1 | 2/2003 | Anderson |
| 6,556,628 B1 | 4/2003 | Poulton |
| 6,563,382 B1 | 5/2003 | Yang |
| 6,621,427 B2 | 9/2003 | Greenstreet |
| 6,624,699 B2 | 9/2003 | Yin |
| 6,650,638 B1 | 11/2003 | Walker |
| 6,661,355 B2 | 12/2003 | Cornelius |
| 6,664,355 B2 | 12/2003 | Kim |
| 6,686,879 B2 | 2/2004 | Shattil |
| 6,690,739 B1 | 2/2004 | Mui |
| 6,766,342 B2 | 7/2004 | Kechriotis |
| 6,772,351 B1 | 8/2004 | Werner |
| 6,839,429 B1 | 1/2005 | Gaikwad |
| 6,839,587 B2 | 1/2005 | Yonce |
| 6,854,030 B2 | 2/2005 | Perino |
| 6,865,234 B1 | 3/2005 | Agazzi |
| 6,865,236 B1 | 3/2005 | Terry |
| 6,898,724 B2 | 5/2005 | Chang |
| 6,927,709 B2 | 8/2005 | Kiehl |
| 6,954,492 B1 | 10/2005 | Williams |
| 6,963,622 B2 | 11/2005 | Eroz |
| 6,972,701 B2 | 12/2005 | Jansson |
| 6,973,613 B2 | 12/2005 | Cypher |
| 6,976,194 B2 | 12/2005 | Cypher |
| 6,982,954 B2 | 1/2006 | Dhong |
| 6,990,138 B2 | 1/2006 | Bejjani |
| 6,999,516 B1 | 2/2006 | Rajan |
| 7,023,817 B2 | 4/2006 | Kuffner |
| 7,039,136 B2 | 5/2006 | Olson |
| 7,053,802 B2 | 5/2006 | Cornelius |
| 7,075,996 B2 | 7/2006 | Simon |
| 7,080,288 B2 | 7/2006 | Ferraiolo |
| 7,082,557 B2 | 7/2006 | Schauer |
| 7,085,153 B2 | 8/2006 | Ferrant |
| 7,085,336 B2 | 8/2006 | Lee |
| 7,127,003 B2 | 10/2006 | Rajan |
| 7,130,944 B2 | 10/2006 | Perino |
| 7,142,612 B2 | 11/2006 | Horowitz |
| 7,142,865 B2 | 11/2006 | Tsai |
| 7,164,631 B2 | 1/2007 | Tateishi |
| 7,167,019 B2 | 1/2007 | Broyde |
| 7,176,823 B2 | 2/2007 | Zabroda |
| 7,180,949 B2 | 2/2007 | Kleveland |
| 7,184,483 B2 | 2/2007 | Rajan |
| 7,199,728 B2 | 4/2007 | Dally |
| 7,231,558 B2 | 6/2007 | Gentieu |
| 7,269,212 B1 | 9/2007 | Chau |
| 7,335,976 B2 | 2/2008 | Chen |
| 7,336,112 B1 | 2/2008 | Sha |
| 7,339,990 B2 | 3/2008 | Hidaka |
| 7,346,819 B2 | 3/2008 | Bansal |
| 7,348,989 B2 | 3/2008 | Stevens |
| 7,349,484 B2 | 3/2008 | Stojanovic |
| 7,356,213 B1 | 4/2008 | Cunningham |
| 7,358,869 B1 | 4/2008 | Chiarulli |
| 7,362,130 B2 | 4/2008 | Broyde |
| 7,362,697 B2 | 4/2008 | Becker |
| 7,366,942 B2 | 4/2008 | Lee |
| 7,370,264 B2 | 5/2008 | Worley |
| 7,372,390 B2 | 5/2008 | Yamada |
| 7,389,333 B2 | 6/2008 | Moore |
| 7,397,302 B2 | 7/2008 | Bardsley |
| 7,400,276 B1 | 7/2008 | Sotiriadis |
| 7,428,273 B2 | 9/2008 | Foster |
| 7,456,778 B2 | 11/2008 | Werner |
| 7,462,956 B2 | 12/2008 | Lan |
| 7,496,162 B2 | 2/2009 | Srebranig |
| 7,570,704 B2 | 4/2009 | Nagarajan |
| 7,535,957 B2 | 5/2009 | Ozawa |
| 7,539,532 B2 | 5/2009 | Tran |
| 7,599,390 B2 | 10/2009 | Pamarti |
| 7,613,234 B2 | 11/2009 | Raghavan |
| 7,616,075 B2 | 11/2009 | Kushiyama |

(56) References Cited

U.S. PATENT DOCUMENTS

| | | |
|---|---|---|
| 7,620,116 B2 | 11/2009 | Bessios |
| 7,633,850 B2 | 12/2009 | Nagarajan |
| 7,639,596 B2 | 12/2009 | Cioffi |
| 7,643,588 B2 | 1/2010 | Visalli |
| 7,656,321 B2 | 2/2010 | Wang |
| 7,694,204 B2 | 4/2010 | Schmidt |
| 7,697,915 B2 | 4/2010 | Behzad |
| 7,698,088 B2 | 4/2010 | Sul |
| 7,706,456 B2 | 4/2010 | Laroia |
| 7,706,524 B2 | 4/2010 | Zerbe |
| 7,746,764 B2 | 6/2010 | Rawlins |
| 7,768,312 B2 | 8/2010 | Hirose |
| 7,787,572 B2 | 8/2010 | Scharf |
| 7,804,361 B2 | 9/2010 | Lim |
| 7,808,456 B2 | 10/2010 | Chen |
| 7,808,883 B2 | 10/2010 | Green |
| 7,841,909 B2 | 11/2010 | Murray |
| 7,869,497 B2 | 1/2011 | Benvenuto |
| 7,869,546 B2 | 1/2011 | Tsai |
| 7,882,413 B2 | 2/2011 | Chen |
| 7,899,653 B2 | 3/2011 | Hollis |
| 7,907,676 B2 | 3/2011 | Stojanovic |
| 7,933,770 B2 | 4/2011 | Kruger |
| 8,000,664 B2 | 8/2011 | Khorram |
| 8,030,999 B2 | 10/2011 | Chatterjee |
| 8,036,300 B2 | 10/2011 | Evans |
| 8,050,332 B2 | 11/2011 | Chung |
| 8,055,095 B2 | 11/2011 | Palotai |
| 8,064,535 B2 | 11/2011 | Wiley |
| 8,085,172 B2 | 12/2011 | Li |
| 8,091,006 B2 | 1/2012 | Prasad |
| 8,106,806 B2 | 1/2012 | Toyomura |
| 8,149,906 B2 | 4/2012 | Saito |
| 8,159,375 B2 | 4/2012 | Abbasfar |
| 8,159,376 B2 | 4/2012 | Abbasfar |
| 8,180,931 B2 | 5/2012 | Lee |
| 8,185,807 B2 | 5/2012 | Oh |
| 8,199,849 B2 | 6/2012 | Oh |
| 8,199,863 B2 | 6/2012 | Chen |
| 8,218,670 B2 | 7/2012 | AbouRjeily |
| 8,233,544 B2 | 7/2012 | Bao |
| 8,245,094 B2 | 8/2012 | Jiang |
| 8,253,454 B2 | 8/2012 | Lin |
| 8,279,094 B2 | 10/2012 | Abbasfar |
| 8,279,745 B2 | 10/2012 | Dent |
| 8,289,914 B2 | 10/2012 | Li |
| 8,295,250 B2 | 10/2012 | Gorokhov |
| 8,295,336 B2 | 10/2012 | Lutz |
| 8,305,247 B2 | 11/2012 | Pun |
| 8,310,389 B1 | 11/2012 | Chui |
| 8,341,492 B2 | 12/2012 | Shen |
| 8,359,445 B2 | 1/2013 | Ware |
| 8,365,035 B2 | 1/2013 | Hara |
| 8,406,315 B2 | 3/2013 | Tsai |
| 8,406,316 B2 | 3/2013 | Sugita |
| 8,429,492 B2 | 4/2013 | Yoon |
| 8,429,495 B2 | 4/2013 | Przybylski |
| 8,437,440 B1 | 5/2013 | Zhang |
| 8,442,099 B1 | 5/2013 | Sederat |
| 8,442,210 B2 | 5/2013 | Zerbe |
| 8,443,223 B2 | 5/2013 | Abbasfar |
| 8,451,913 B2 | 5/2013 | Oh |
| 8,462,891 B2 | 6/2013 | Kizer |
| 8,472,513 B2 | 6/2013 | Malipatil |
| 8,620,166 B2 | 6/2013 | Dong |
| 8,498,344 B2 | 7/2013 | Wilson |
| 8,498,368 B1 | 7/2013 | Husted |
| 8,520,348 B2 | 8/2013 | Dong |
| 8,520,493 B2 | 8/2013 | Goulahsen |
| 8,539,318 B2 | 9/2013 | Cronie |
| 8,547,272 B2 | 10/2013 | Nestler |
| 8,577,284 B2 | 11/2013 | Seo |
| 8,578,246 B2 | 11/2013 | Mittelholzer |
| 8,588,254 B2 | 11/2013 | Diab |
| 8,588,280 B2 | 11/2013 | Oh |
| 8,593,305 B1 | 11/2013 | Tajalli |
| 8,602,643 B2 | 12/2013 | Gardiner |
| 8,604,879 B2 | 12/2013 | Mourant |
| 8,638,241 B2 | 1/2014 | Sudhakaran |
| 8,643,437 B2 | 2/2014 | Chiu |
| 8,649,445 B2 | 2/2014 | Cronie |
| 8,649,460 B2 | 2/2014 | Ware |
| 8,674,861 B2 | 3/2014 | Matsuno |
| 8,687,968 B2 | 4/2014 | Nosaka |
| 8,711,919 B2 | 4/2014 | Kumar |
| 8,718,184 B1 | 5/2014 | Cronie |
| 8,744,012 B1* | 6/2014 | Ding ............... H04L 1/203 375/316 |
| 8,755,426 B1 | 6/2014 | Cronie |
| 8,773,964 B2 | 7/2014 | Hsueh |
| 8,780,687 B2 | 7/2014 | Clausen |
| 8,782,578 B2 | 7/2014 | Tell |
| 8,791,735 B1 | 7/2014 | Shibasaki |
| 8,831,440 B2 | 9/2014 | Yu |
| 8,841,936 B2 | 9/2014 | Nakamura |
| 8,879,660 B1 | 11/2014 | Peng |
| 8,897,134 B2 | 11/2014 | Kern |
| 8,898,504 B2 | 11/2014 | Baumgartner |
| 8,938,171 B2 | 1/2015 | Tang |
| 8,949,693 B2 | 2/2015 | Ordentlich |
| 8,951,072 B2 | 2/2015 | Hashim |
| 8,975,948 B2 | 3/2015 | GonzalezDiaz |
| 8,989,317 B1 | 3/2015 | Holden |
| 9,015,566 B2 | 4/2015 | Cronie |
| 9,020,049 B2 | 4/2015 | Schwager |
| 9,036,764 B1 | 5/2015 | Hossain |
| 9,069,995 B1 | 6/2015 | Cronie |
| 9,077,386 B1 | 7/2015 | Holden |
| 9,083,576 B1 | 7/2015 | Hormati |
| 9,093,791 B2 | 7/2015 | Liang |
| 9,100,232 B1 | 8/2015 | Hormati |
| 9,106,465 B2 | 8/2015 | Walter |
| 9,124,557 B2 | 9/2015 | Fox |
| 9,148,087 B1 | 9/2015 | Tajalli |
| 9,152,495 B2 | 10/2015 | Losh |
| 9,165,615 B2 | 10/2015 | Amirkhany |
| 9,172,412 B2 | 10/2015 | Kim |
| 9,178,503 B2 | 11/2015 | Hsieh |
| 9,183,085 B1 | 11/2015 | Northcott |
| 9,197,470 B2 | 11/2015 | Okunev |
| 9,281,785 B2 | 3/2016 | Sjoland |
| 9,288,082 B1 | 3/2016 | Ulrich |
| 9,288,089 B2 | 3/2016 | Cronie |
| 9,292,716 B2 | 3/2016 | Winoto |
| 9,300,503 B1 | 3/2016 | Holden |
| 9,306,621 B2 | 4/2016 | Zhang |
| 9,331,962 B2 | 5/2016 | Lida |
| 9,362,974 B2 | 6/2016 | Fox |
| 9,363,114 B2 | 6/2016 | Shokrollahi |
| 9,374,250 B1 | 6/2016 | Musah |
| 9,401,828 B2 | 7/2016 | Cronie |
| 9,432,082 B2 | 8/2016 | Ulrich |
| 9,432,298 B1 | 8/2016 | Smith |
| 9,444,654 B2 | 9/2016 | Hormati |
| 9,455,744 B2 | 9/2016 | George |
| 9,455,765 B2 | 9/2016 | Schumacher |
| 9,461,862 B2 | 10/2016 | Holden |
| 9,479,369 B1 | 10/2016 | Shokrollahi |
| 9,509,437 B2 | 11/2016 | Shokrollahi |
| 9,520,883 B2 | 12/2016 | Shibasaki |
| 9,544,015 B2 | 1/2017 | Ulrich |
| 9,634,797 B2 | 4/2017 | Benammar |
| 9,667,379 B2 | 5/2017 | Cronie |
| 9,917,711 B2 | 3/2018 | Ulrich |
| 2001/0006538 A1 | 7/2001 | Simon |
| 2001/0055344 A1 | 12/2001 | Lee |
| 2002/0034191 A1 | 3/2002 | Shattil |
| 2002/0044316 A1 | 4/2002 | Myers |
| 2002/0057592 A1 | 5/2002 | Robb |
| 2002/0154633 A1 | 10/2002 | Shin |
| 2002/0163881 A1 | 11/2002 | Dhong |
| 2002/0167339 A1 | 11/2002 | Chang |
| 2002/0174373 A1 | 11/2002 | Chang |
| 2002/0181607 A1 | 12/2002 | Izumi |

(56) References Cited

U.S. PATENT DOCUMENTS

| | | |
|---|---|---|
| 2003/0016763 A1 | 1/2003 | Doi |
| 2003/0016770 A1 | 1/2003 | Trans |
| 2003/0046618 A1 | 3/2003 | Collins |
| 2003/0085763 A1 | 5/2003 | Schrodinger |
| 2003/0146783 A1 | 8/2003 | Bandy |
| 2003/0174023 A1 | 9/2003 | Miyasita |
| 2003/0185310 A1 | 10/2003 | Ketchum |
| 2003/0218558 A1 | 11/2003 | Mulder |
| 2004/0027185 A1 | 2/2004 | Fiedler |
| 2004/0155802 A1 | 8/2004 | Lamy |
| 2004/0161019 A1 | 8/2004 | Raghavan |
| 2004/0170231 A1 | 9/2004 | Bessios |
| 2005/0063493 A1 | 3/2005 | Foster |
| 2005/0134380 A1 | 6/2005 | Nairn |
| 2005/0174841 A1 | 8/2005 | Ho |
| 2005/0195000 A1 | 9/2005 | Parker |
| 2005/0201491 A1 | 9/2005 | Wei |
| 2005/0213686 A1 | 9/2005 | Love |
| 2005/0220182 A1 | 10/2005 | Kuwata |
| 2005/0270098 A1 | 12/2005 | Zhang |
| 2006/0036668 A1 | 2/2006 | Jaussi |
| 2006/0097786 A1 | 5/2006 | Su |
| 2006/0103463 A1 | 5/2006 | Lee |
| 2006/0120486 A1 | 6/2006 | Visalli |
| 2006/0126751 A1 | 6/2006 | Bessios |
| 2006/0133538 A1 | 6/2006 | Stojanovic |
| 2006/0140324 A1 | 6/2006 | Casper |
| 2006/0159005 A1 | 7/2006 | Rawlins |
| 2006/0232461 A1 | 10/2006 | Felder |
| 2006/0233291 A1 | 10/2006 | Garlepp |
| 2006/0291589 A1 | 12/2006 | Eliezer |
| 2007/0001723 A1 | 1/2007 | Lin |
| 2007/0002954 A1 | 1/2007 | Cornelius |
| 2007/0030796 A1 | 2/2007 | Green |
| 2007/0103338 A1 | 5/2007 | Teo |
| 2007/0121716 A1 | 5/2007 | Nagarajan |
| 2007/0182487 A1 | 8/2007 | Ozasa |
| 2007/0201546 A1 | 8/2007 | Lee |
| 2007/0201597 A1 | 8/2007 | He |
| 2007/0263711 A1 | 11/2007 | Kramer |
| 2007/0283210 A1 | 12/2007 | Prasad |
| 2008/0007367 A1 | 1/2008 | Kim |
| 2008/0012598 A1 | 1/2008 | Mayer |
| 2008/0104374 A1 | 5/2008 | Mohamed |
| 2008/0159448 A1 | 7/2008 | Anim-Appiah |
| 2008/0317188 A1 | 12/2008 | Staszewski |
| 2009/0059782 A1 | 3/2009 | Cole |
| 2009/0115523 A1 | 5/2009 | Akizuki |
| 2009/0154604 A1 | 6/2009 | Lee |
| 2009/0262876 A1 | 10/2009 | Arima |
| 2009/0316730 A1 | 12/2009 | Feng |
| 2009/0323864 A1 | 12/2009 | Tired |
| 2010/0046644 A1 | 2/2010 | Mazet |
| 2010/0081451 A1 | 4/2010 | Mueck |
| 2010/0148819 A1 | 6/2010 | Bae |
| 2010/0180143 A1 | 7/2010 | Ware |
| 2010/0215087 A1 | 8/2010 | Tsai |
| 2010/0215112 A1 | 8/2010 | Tsai |
| 2010/0271107 A1 | 10/2010 | Tran |
| 2010/0283894 A1 | 11/2010 | Horan |
| 2010/0296556 A1 | 11/2010 | Rave |
| 2010/0309964 A1 | 12/2010 | Oh |
| 2010/0329325 A1* | 12/2010 | Mobin ............ H04L 25/03057 375/232 |
| 2011/0014865 A1 | 1/2011 | Seo |
| 2011/0028089 A1 | 2/2011 | Komori |
| 2011/0032977 A1 | 2/2011 | Hsiao |
| 2011/0051854 A1 | 3/2011 | Kizer |
| 2011/0072330 A1 | 3/2011 | Kolze |
| 2011/0074488 A1 | 3/2011 | Broyde |
| 2011/0084737 A1 | 4/2011 | Oh |
| 2011/0103508 A1 | 5/2011 | Mu |
| 2011/0127990 A1 | 6/2011 | Wilson |
| 2011/0228864 A1 | 9/2011 | Aryanfar |
| 2011/0235501 A1 | 9/2011 | Goulahsen |
| 2011/0268225 A1 | 11/2011 | Cronie |
| 2011/0299555 A1 | 12/2011 | Cronie |
| 2011/0302478 A1 | 12/2011 | Cronie |
| 2011/0317559 A1 | 12/2011 | Kern |
| 2012/0082203 A1 | 4/2012 | Zerbe |
| 2012/0133438 A1 | 5/2012 | Tsuchi |
| 2012/0152901 A1 | 6/2012 | Nagorny |
| 2012/0161945 A1 | 6/2012 | Single |
| 2012/0213299 A1 | 8/2012 | Cronie |
| 2012/0257683 A1 | 10/2012 | Schwager |
| 2013/0010892 A1 | 1/2013 | Cronie |
| 2013/0013870 A1 | 1/2013 | Cronie |
| 2013/0088274 A1 | 4/2013 | Gu |
| 2013/0106513 A1 | 5/2013 | Cyrusian |
| 2013/0114519 A1 | 5/2013 | Gaal |
| 2013/0114663 A1 | 5/2013 | Ding |
| 2013/0129019 A1 | 5/2013 | Sorrells |
| 2013/0147553 A1 | 6/2013 | Iwamoto |
| 2013/0195155 A1 | 8/2013 | Pan |
| 2013/0202065 A1 | 8/2013 | Chmelar |
| 2013/0215954 A1 | 8/2013 | Beukema |
| 2013/0259113 A1 | 10/2013 | Kumar |
| 2013/0271194 A1 | 10/2013 | Pellerano |
| 2013/0307614 A1 | 11/2013 | Dai |
| 2013/0314142 A1 | 11/2013 | Tamura |
| 2013/0346830 A1 | 12/2013 | Ordentlich |
| 2014/0159769 A1 | 6/2014 | Hong |
| 2014/0177696 A1 | 6/2014 | Hwang |
| 2014/0266440 A1 | 9/2014 | Itagaki |
| 2014/0269130 A1 | 9/2014 | Maeng |
| 2014/0286381 A1 | 9/2014 | Shibasaki |
| 2015/0049798 A1 | 2/2015 | Hossein |
| 2015/0070201 A1 | 3/2015 | Dedic |
| 2015/0078479 A1 | 3/2015 | Whitby-Strevens |
| 2015/0117579 A1 | 4/2015 | Shibasaki |
| 2015/0146771 A1 | 5/2015 | Walter |
| 2015/0222458 A1 | 8/2015 | Hormati |
| 2015/0249559 A1 | 9/2015 | Shokrollahi |
| 2015/0256326 A1* | 9/2015 | Simpson ............ H04L 7/0025 375/355 |
| 2015/0333940 A1 | 11/2015 | Shokrollahi |
| 2015/0349835 A1 | 12/2015 | Fox |
| 2015/0381232 A1 | 12/2015 | Ulrich |
| 2016/0020796 A1 | 1/2016 | Hormati |
| 2016/0020824 A1 | 1/2016 | Ulrich |
| 2016/0036616 A1 | 2/2016 | Holden |
| 2016/0197747 A1 | 7/2016 | Ulrich |
| 2016/0261435 A1 | 9/2016 | Musah |
| 2017/0310456 A1 | 10/2017 | Tajalli |
| 2017/0317449 A1 | 11/2017 | Shokrollahi |
| 2017/0317855 A1 | 11/2017 | Shokrollahi |

FOREIGN PATENT DOCUMENTS

| | | |
|---|---|---|
| EP | 1926267 | 5/2008 |
| EP | 2039221 | 2/2013 |
| JP | 2003163612 | 6/2003 |
| WO | 2005002162 | 1/2005 |
| WO | 2009084121 | 7/2009 |
| WO | 2010031824 | 3/2010 |
| WO | 2011119359 | 9/2011 |

OTHER PUBLICATIONS

Hidaka, et al., "A 4-Channel 125-10.3 Gb/s Backplane Transceiver Macro With35 dB Equalizer and Sign-Based Zero-Forcing Adaptive Control", IEEE Journal of Solid-State Circuits, vol. 44 No. 12, Dec. 2009, pp. 3547-3559.

Giovaneli, et al., "Space-frequency coded OFDM system for multi-wire power line communications", Power Line Communications and Its Applications, 20015 International Symposium on Vancouver, BC, Canada, Apr. 6-8, 2005, Piscataway, NJ, pp. 191-195.

"Introduction to: Analog Computers and the DSPACE System," Course Material ECE 5230 Spring 2008, Utah State University, www.coursehero.com, 12 pages.

(56) References Cited

OTHER PUBLICATIONS

Abbasfar, A., "Generalized Differential Vector Signaling", IEEE International Conference on Communications, ICC '09, (Jun. 14, 2009), pp. 1-5.
Brown, L., et al., "V.92: The Last Dial-Up Modem?", IEEE Transactions on Communications, IEEE Service Center, Piscataway, NJ., USA, vol. 52, No. 1, Jan. 1, 2004, pp. 54-61. XP011106836, ISSN: 0090-6779, DOI: 10.1109/tcomm.2003.822168, pp. 55-59.
Burr, "Spherical Codes for M-ARY Code Shift Keying", University of York, Apr. 2, 1989, pp. 67-72, United Kingdom.
Cheng, W., "Memory Bus Encoding for Low Power: A Tutorial", Quality Electronic Design, IEEE, International Symposium on Mar. 26-28, 2001, pp. 199-204, Piscataway, NJ.
Clayton, P., "Introduction to Electromagnetic Compatibility", Wiley-Interscience, 2006.
Counts, L., et al., "One-Chip Slide Rule Works with Logs, Antilogs for Real-Time Processing," Analog Devices Computational Products 6, Reprinted from Electronic Design, May 2, 1985, 7 pages.
Dasilva et al., "Multicarrier Orthogonal CDMA Signals for Quasi-Synchronous Communication Systems", IEEE Journal on Selected Areas in Communications, vol. 12, No. 5 (Jun. 1, 1994), pp. 842-852.
Design Brief 208 Using the Anadigm Multiplier CAM, Copyright 2002 Anadigm, 6 pages.
Ericson, T., et al., "Spherical Codes Generated by Binary Partitions of Symmetric Pointsets", IEEE Transactions on Information Theory, vol. 41, No. 1, Jan. 1995, pp. 107-129.
Farzan, K., et al., "Coding Schemes for Chip-to-Chip Interconnect Applications", IEEE Transactions on Very Large Scale Integration (VLSI) Systems, vol. 14, No. 4, Apr. 2006, pp. 393-406.
Grahame, J., "Vintage Analog Computer Kits," posted on Aug. 25, 2006 in Classic Computing, 2 pages, http://www.retrothing.com/2006/08/classic_analog_.html.
Healey, A., et al., "A Comparison of 25 Gbps NRZ & PAM-4 Modulation used in Legacy & Premium Backplane Channels", DesignCon 2012, 16 pages.
International Search Report and Written Opinion for PCT/EP2011/059279 dated Sep. 22, 2011.
International Search Report and Written Opinion for PCT/EP2011/074219 dated Jul. 4, 2012.
International Search Report and Written Opinion for PCT/EP2012/052767 dated May 11, 2012.
International Search Report and Written Opinion for PCT/US14/052986 dated Nov. 24, 2014.
International Search Report and Written Opinion from PCT/US2014/034220 dated Aug. 21, 2014.
International Search Report and Written Opinion of the International Searching Authority, dated Jul. 14, 2011 in International Patent Application S.N. PCT/EP2011/002170, 10 pages.
International Search Report and Written Opinion of the International Searching Authority, dated Nov. 5, 2012, in International Patent Application S.N. PCT/EP2012/052767, 7 pages.
International Search Report for PCT/US2014/053563, dated Nov. 11, 2014, 2 pages.
Jiang, A., et al., "Rank Modulation for Flash Memories", IEEE Transactions of Information Theory, Jun. 2006, vol. 55, No. 6, pp. 2659-2673.
Loh, M., et al., "A 3x9 Gb/s Shared, All-Digital CDR for High-Speed, High-Density I/O", Matthew Loh, IEEE Journal of Solid-State Circuits, Vo. 47, No. 3, Mar. 2012.
Notification of Transmittal of International Search Report and the Written Opinion of the International Searching Authority, for PCT/US2015/018363, dated Jun. 18, 2015, 13 pages.
Notification of Transmittal of the International Search Report and the Written Opinion of the International Searching Authority, or the Declaration for PCT/EP2013/002681, dated Feb. 25, 2014, 15 pages.
Notification of Transmittal of the International Search Report and the Written Opinion of the International Searching Authority, or the Declaration, dated Mar. 3, 2015, for PCT/US2014/066893, 9 pages.
Notification of Transmittal of the International Search Report and the Written Opinion of the International Searching Authority, or the Declaration, for PCT/US2014/015840, dated May 20, 2014. 11 pages.
Notification of Transmittal of the International Search Report and the Written Opinion of the International Searching Authority, or the Declaration, for PCT/US2014/043965, dated Oct. 22, 2014, 10 pages.
Notification of Transmittal of the International Search Report and the Written Opinion of the International Searching Authority, or the Declaration, for PCT/US2015/037466, dated Nov. 19, 2015.
Notification of Transmittal of the International Search Report and the Written Opinion of the International Searching Authority, or the Declaration, for PCT/US2015/039952, dated Sep. 23, 2015, 8 pages.
Notification of Transmittal of the International Search Report and the Written Opinion of the International Searching Authority, or the Declaration, for PCT/US2015/041161, dated Oct. 7, 2015, 8 pages.
Notification of Transmittal of the International Search Report and the Written Opinion of the International Searching Authority, or the Declaration, for PCT/US2015/043463, dated Oct. 16, 2015, 8 pages.
Oh, et al., Pseudo-Differential Vector Signaling for Noise Reduction in Single-Ended Signaling, DesignCon 2009.
Poulton, et al., "Multiwire Differential Signaling", UNC-CH Department of Computer Science Version 1.1, Aug. 6, 2003.
Schneider, J., et al., "ELEC301 Project: Building an Analog Computer," Dec. 19, 1999, 8 pages, http://www.clear.rice.edu/elec301/Projects99/anlgcomp/.
She et al., "A Framework of Cross-Layer Superposition Coded Multicast for Robust IPTV Services over WiMAX," IEEE Communications Society subject matter experts for publication in the WCNC 2008 proceedings, Mar. 31, 2008-Apr. 3, 2008, pp. 3139-3144.
Skliar et al., A Method for the Analysis of Signals: the Square-Wave Method, Mar, 2008, Revista de Matematica: Teoria y Aplicationes, pp. 109-129.
Slepian, D., "Premutation Modulation", IEEE, vol. 52, No. 3, Mar. 1965, pp. 228-236.
Stan, M., et al., "Bus-Invert Coding for Low-Power I/O, IEEE Transactions on Very Large Scale Integration (VLSI) Systems", vol. 3, No. 1, Mar. 1995, pp. 49-58.
Tallini, L., et al., "Transmission Time Analysis for the Parallel Asynchronous Communication Scheme", IEEE Transactions on Computers, vol. 52, No. 5, May 2003, pp. 558-571.
Tierney, J., et al., "A digital frequency synthesizer," Audio and Electroacoustics, IEEE Transactions, Mar. 1971, pp. 48-57, vol. 19, Issue 1, 1 page Abstract from http://ieeexplore.
Wang et al., "Applying CDMA Technique to Network-on-Chip", IEEE Transactions on Very Large Scale Integration (VLSI) Systems, vol. 15, No. 10 (Oct. 1, 2007), pp. 1091-1100.
Zouhair Ben-Neticha et al, "The 'streTched"-Golay and other codes for high-SNR fnite-delay quantization of the Gaussian source at 1/2 Bit per sample, IEEE Transactions on Communications, vol. 38, No. 12 Dec. 1, 1990, pp. 2089-2093, XP000203339, ISSN: 0090-6678, DOI: 10.1109/26.64647.
Notification of Transmittal of the International Search Report and the Written Opinion of the International Searching Authority, or the Declaration, dated Feb. 15, 2017, 10 pages.
Notification of Transmittal of the International Search Report and the Written Opinion of the International Searching Authority, or the Declaration., for PCT/US17/14997, dated Apr. 7, 2017.
Holden, B., "Simulation results for NRZ, ENRZ & PAM-4 on 16-wire full-sized 400GE backplanes", IEEE 802.3 400GE Study Group, Sep. 2, 2013, 19 pages, www.ieee802.0rg/3/400GSG/publiv/13_09/holden_400_01_0913.pdf.
Holden, B., "An exploration of the technical feasibility of the major technology options for 400GE backplanes", IEEE 802.3 400GE Study Group, Jul. 16, 2013, 18 pages, http://ieee802.org/3/400GSG/public/13_07/holden_400_01_0713.pdf.
Holden, B., "Using Ensemble NRZ Coding for 400GE Electrical Interfaces", IEEE 802.3 400GE Study Group, May 17, 2013, 24

(56) References Cited

OTHER PUBLICATIONS pages, http://www.ieee802.org/3/400GSG/public/13_05/holden_400_01_0513.pdf.

* cited by examiner

PHASE ROTATION CIRCUIT FOR EYE SCOPE MEASUREMENTS

CROSS-REFERENCE TO RELATED APPLICATIONS

This application claims the benefit of U.S. Provisional Application No. 62/395,993, filed Sep. 16, 2016, entitled "Matrix Phase Detector Element for Phase Locked Loop", the contents of which is hereby incorporated by reference in its entirety.

REFERENCES

The following prior applications are herein incorporated by reference in their entirety for all purposes:

U.S. Patent Publication 2011/0268225 of application Ser. No. 12/784,414, filed May 20, 2010, naming Harm Cronie and Amin Shokrollahi, entitled "Orthogonal Differential Vector Signaling" (hereinafter "Cronie I").

U.S. Patent Publication 2011/0302478 of application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II").

U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes" (hereinafter "Cronie III").

U.S. patent application Ser. No. 13/176,657, filed Jul. 5, 2011, naming Harm Cronie and Amin Shokrollahi, entitled "Methods and Systems for Low-power and Pin-efficient Communications with Superposition Signaling Codes" (hereinafter "Cronie IV").

U.S. patent application Ser. No. 13/542,599, filed Jul. 5, 2012, naming Armin Tajalli, Harm Cronie, and Amin Shokrollhi entitled "Methods and Circuits for Efficient Processing and Detection of Balanced Codes" (hereafter called "Tajalli I".)

U.S. patent application Ser. No. 13/842,740, filed Mar. 15, 2013, naming Brian Holden, Amin Shokrollahi and Anant Singh, entitled "Methods and Systems for Skew Tolerance in and Advanced Detectors for Vector Signaling Codes for Chip-to-Chip Communication", hereinafter identified as [Holden I];

U.S. Provisional Patent Application No. 61/946,574, filed Feb. 28, 2014, naming Amin Shokrollahi, Brian Holden, and Richard Simpson, entitled "Clock Embedded Vector Signaling Codes", hereinafter identified as [Shokrollahi I].

U.S. patent application Ser. No. 14/612,241, filed Aug. 4, 2015, naming Amin Shokrollahi, Ali Hormati, and Roger Ulrich, entitled "Method and Apparatus for Low Power Chip-to-Chip Communications with Constrained ISI Ratio", hereinafter identified as [Shokrollahi II].

U.S. patent application Ser. No. 13/895,206, filed May 15, 2013, naming Roger Ulrich and Peter Hunt, entitled "Circuits for Efficient Detection of Vector Signaling Codes for Chip-to-Chip Communications using Sums of Differences", hereinafter identified as [Ulrich I].

U.S. patent application Ser. No. 14/816,896, filed Aug. 3, 2015, naming Brian Holden and Amin Shokrollahi, entitled "Orthogonal Differential Vector Signaling Codes with Embedded Clock", hereinafter identified as [Holden II].

U.S. patent application Ser. No. 14/926,958, filed Oct. 29, 2015, naming Richard Simpson, Andrew Stewart, and Ali Hormati, entitled "Clock Data Alignment System for Vector Signaling Code Commuications Link", hereinafter identified as [Stewart I].

U.S. patent application Ser. No. 14/925,686, filed Oct. 28, 2015, naming Armin Tajalli, entitled "Advanced Phase Interpolator", hereinafter identified as [Tajalli II].

U.S. Provisional Patent Application No. 62/286,717, filed Jan. 25, 2016, naming Armin Tajalli, entitled "Voltage Sampler Driver with Enhanced High-Frequency Gain", hereinafter identified as [Tajalli III].

U.S. Provisional Patent Application No. 62/288,717, filed Apr. 22, 2016, naming Armin Tajalli, entitled "High Performance Phase Locked Loop", hereinafter identified as [Tajalli IV].

The following additional references to prior art have been cited in this application:

U.S. Pat. No. 6,509,773, filed Apr. 30, 2001 by Buchwald et al., entitled "Phase interpolator device and method" (hereafter called [Buchwald].

"Linear phase detection using two-phase latch", A. Tajalli, et al., IEE Electronic Letters, 2003, (hereafter called [Tajalli V].)

"A Low-Jitter Low-Phase-Noise 10-GHz Sub-Harmonically Injection-Locked PLL With Self-Aligned DLL in 65-nm CMOS Technology", Hong-Yeh Chang, Yen-Liang Yeh, Yu-Cheng Liu, Meng-Han Li, and Kevin Chen, IEEE Transactions on Microwave Theory and Techniques, Vol 62, No. 3, March 2014 pp. 543-555, (hereafter called [Chang et al.])

"Low Phase Noise 77-GHz Fractional-N PLL with DLL-based Reference Frequency Multiplier for FMCW Radars", Herman Jalli Ng, Rainer Stuhlberger, Linus Maurer, Thomas Sailer, and Andreas Stelzer, Proceedings of the 6th European Microwave Integrated Circuits Conference, 10-11 October 2011, pp. 196-199, (hereafter called [Ng et al.])

"Design of Noise-Robust Clock and Data Recovery using an Adaptive-Bandwidth Mixed PLL/DLL", Han-Yuan Tan, Doctoral Thesis, Harvard University November 2006, (hereafter called [Tan]).

U.S. Pat. No. 7,492,850, filed Aug. 31, 2005 by Christian Ivo Menolfi and Thomas Helmut Toifl, entitled "Phase locked loop apparatus with adjustable phase shift" (hereafter called [Menolfi].)

"A Calibration-Free Fractional-N Ring PLL Using Hybrid Phase/Current-Mode Phase Interpolation Method", by Romesh Kumar Nandwana et al, IEEE Journal of Solid-State Circuits Vol. 50, No. 4, April 2015, ppg. 882-895, (hereafter called [Nandwana].)

FIELD OF THE INVENTION

The present embodiments relate to communications systems circuits generally, and more particularly to obtaining a stable, correctly phased receiver clock signal from a high-speed multi-wire interface used for chip-to-chip communication.

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods have been proposed to further optimize the trade-offs between power consumption, pin efficiency and noise robustness of chip-to-chip communication systems. In those vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or more receivers. At a receiver, the received signals corresponding to the codeword are transformed back into the original digital information representation space. Herein, this process is referred to as "decoding".

Regardless of the encoding method used, the received signals presented to the receiving device are sampled (or their signal value otherwise recorded) at intervals best representing the original transmitted values, regardless of transmission channel delays, interference, and noise. This Clock and Data Recovery (CDR) not only determine the appropriate sample timing, but may continue to do so continuously, providing dynamic compensation for varying signal propagation conditions.

Many known CDR systems utilize a Phase-Locked Loop (PLL) or Delay-Locked Loop (DLL) to synthesize a local receive clock having an appropriate frequency and phase for accurate receive data sampling.

BRIEF DESCRIPTION

To reliably detect the data values transmitted over a communications system, a receiver accurately measures the received signal value amplitudes at carefully selected times. Various methods are known to facilitate such receive measurements, including reception of one or more dedicated clock signals associated with the transmitted data stream, extraction of clock signals embedded within the transmitted data stream, and synthesis of a local receive clock from known attributes of the communicated data stream.

In general, the receiver embodiments of such timing methods are described as Clock-Data Recovery (CDR), often based on Phase-Lock Loop (PLL) or Delay-Locked Loop (DLL) synthesis of a local receive clock having the desired frequency and phase characteristics.

In both PLL and DLL embodiments, a Phase Detector compares the relative phase (and in some variations, the relative frequency) of a received reference signal and a local clock signal to produce an error signal, which is subsequently used to correct the phase and/or frequency of the local clock source and thus minimize the error. As this feedback loop behavior will lead to a given PLL embodiment producing a fixed phase relationship (as examples, 0 degrees or 90 degrees of phase offset) between the reference signal and the local clock, an additional fixed or variable phase adjustment is often introduced to permit the phase offset to be set to a different desired value (as one example, 45 degrees of phase offset) to facilitate receiver data detection.

Statistical graphs of received data over time, commonly called "eye diagrams" are a well-known tool for analyzing received signal quality. Capturing the data needed to plot such a diagram may include measuring received signals at multiple sampling points distributed across both signal amplitude and time. To avoid disruption of normal data reception, one or more additional data samplers may be provided to perform these measurements independent of the amplitude threshold and time interval chosen for optimum data reception.

Methods and systems are described for obtaining eye measurements by generating a data-sampling clock and a variable-phase-offset eye-measurement clock with a local oscillator and an adjustable phase interpolator, using said sampling clock with a data slicer to obtain a receive sample of a received data signal obtained using a multi-input comparator, and using at least one eye slicer and the variable-phase-offset eye-measurement clock to obtain a plurality of eye characteristic measurements by adjusting a sampling threshold of the at least one eye slicer and a phase offset of the variable-phase-offset eye-measurement clock.

DETAILED DESCRIPTION

Figure 1:
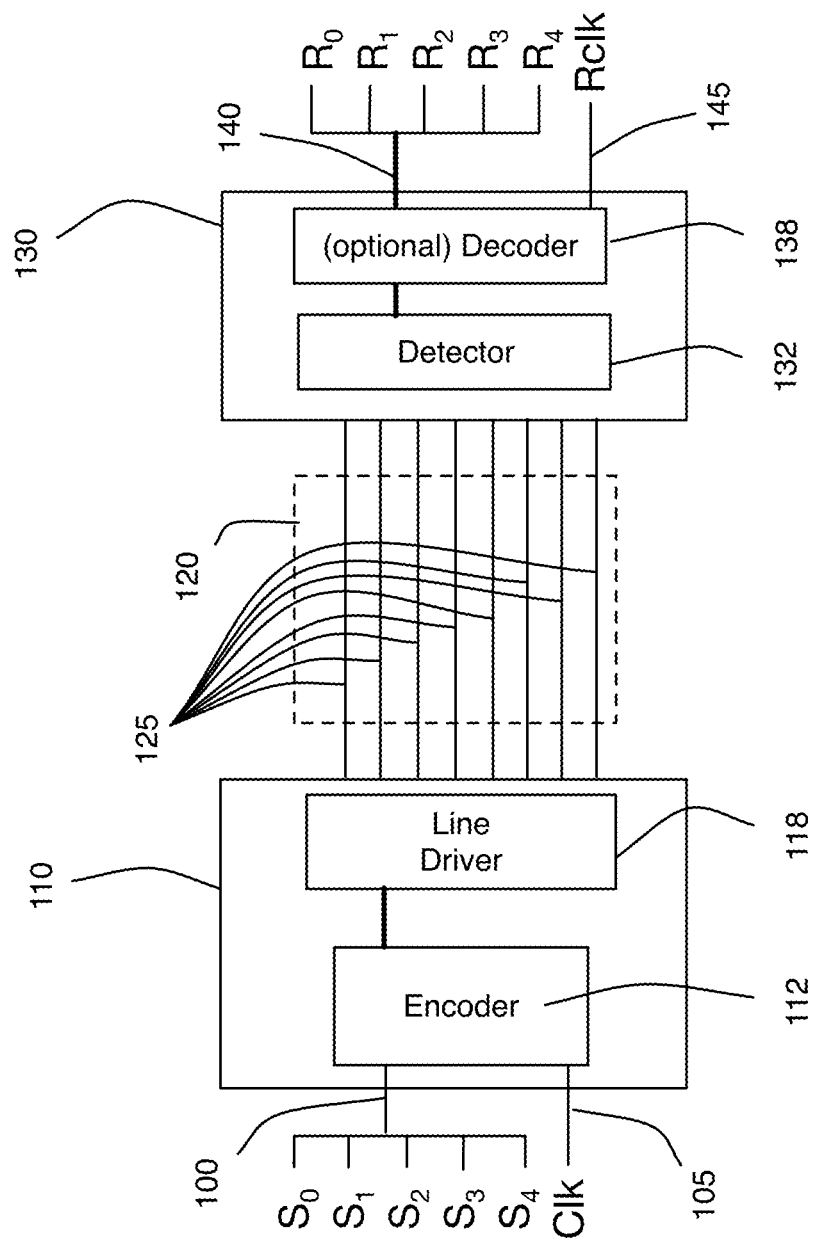
FIG. 1 is a block diagram of a system capable of encoding and transmitting five data bits and a clock on an eight wire communications channel.

As described in [Cronie I], [Cronie II], [Cronie III] and [Cronie IV], vector signaling codes may be used to produce extremely high bandwidth data communications links, such as between two integrated circuit devices in a system. As illustrated by the embodiment of FIG. 1, multiple data communications channels transmit symbols of the vector signaling code, acting together to communicate codewords of the vector signaling code. Depending on the particular vector signaling code used, the number of channels comprising a communications link may range from two to eight or more, and may also communicate one or more clock signals on separate communications channels or as subchannel components of the vector signaling code. In the example of FIG. 1, communication link 120 is illustrated as being composed of eight wires 125, collectively communicating five data values 100 and one clock 105 between transmitter 110 and receiver 130.

Some embodiments additionally support additional modes of operation in which, as one example, some number of data communications channels are reconfigured to support legacy communications protocols such as non-return-to-zero (NRZ) differential signaling.

Embodiments described herein can also be applied to prior art permutation sorting methods not covered by the vector processing methods of [Cronie II], [Cronie III], [Cronie IV], and/or [Tajalli I]. More generally, embodiments may apply to any communication or storage methods requiring coordination of multiple channels or elements of the channel to produce a coherent aggregate result.

Receiver Data Detection

Figure 2:
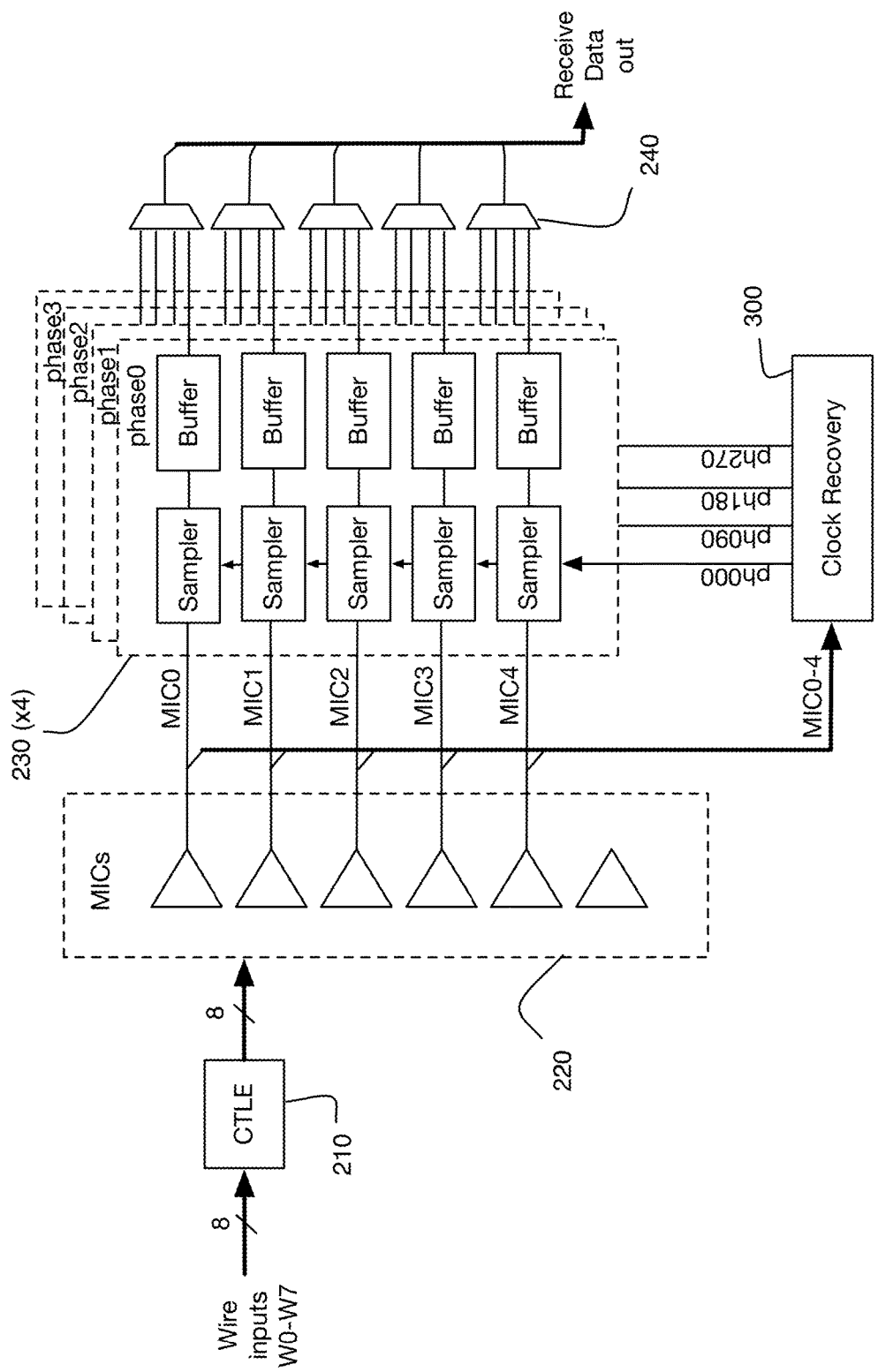
FIG. 2 is a block diagram of one embodiment of a receiver compatible with the system of FIG. 1.

To provide context for the following examples, one typical high-speed receiver embodiment [Stewart I] is used for illustrative purposes, without limitation. As illustrated in FIG. 2, the example data receiver includes eight identical Continuous Time Linear Equalization (CTLE) stages 210 operating on the signals received on the eight wires, previously shown as 120 in FIG. 1.

As described in [Tajalli I], [Holden I] and [Ulrich I], vector signaling codes may be efficiently detected by linearly combining sets of input signals using Multi-Input comparators or mixers (MIC). For the 5b6w code used by the example receiver, five such mixers acting on weighted subsets of the six received data input signals will detect the five data bits without need of further decoding. In one embodiment, one additional mixer acting on combinations of the two received clock signals will similarly detect the clock signal.

Other embodiments may forgo the dedicated wires used to communicate a separate clock signal, and instead the receiver extracts a clock from transitions occurring on the data lines themselves. FIG. 2 illustrates a set of five MIC mixers 220 operate on the received and equalized signals to produce detected signals MIC0-MIC4, with transitions on those data lines collectively used to synchronize a local clock generator 300.

As is well understood in the art, successful application of this technique benefits from a sufficiently large transition density on the data lines (which may be alternatively interpreted as requiring a sufficiently small interval between transitions) and/or sufficient free-running frequency stability within the PLL to maintain accurate data sample timing during non-transition intervals. [Shokrollahi I] describes suitable vector signaling codes having such guaranteed transition density. Alternatively, known art transition-enforcing encoding such as the commonly utilized 8b10b and 64b66b codes may be applied to all or some subset of the data encoded for transmission to insure a guaranteed minimum transition density at the receiver. In one embodiment, bit level transition encoding may be performed on the composite data bit stream, or may be applied to a bit stream being applied to given subchannel, or may be applied to bits being modulated onto subchannels in a given transmit and/or receive slice, or applied to bits being modulated onto a given subchannel (or each subchannel) in each slice.

Because of the high data rates involved, multiple parallel phases of receive processing are shown in the example receiver. In the illustrated example, the five detected data signals MIC0-MIC4 are processed in four parallel phases of receive data processing, each phase 230 including data sampling and subsequent buffering, followed by recombination of the four phase outputs into a received data stream, shown in FIG. 2 as being performed by multiplexers 240.

Clock Recovery circuits (also known in the art as Clock Data Recovery or CDR) support such sampling measurements by extracting timing information, either from the data lines themselves or from dedicated clock signal inputs, and utilize that extracted information to generate clock signals to control the time interval used by the data line sampling device(s). The actual clock extraction may be performed using well known circuits such as a Phase Locked Loop (PLL) or Delay Locked Loop (DLL), which in their operation may also generate higher frequency internal clocks, multiple clock phases, etc. in support of receiver operation. In the embodiment of FIG. 2, the detected clock signal is obtained from data transitions on MIC0-MIC4 and processed 300 to extract properly timed sampling clocks for the four data phases.

Receiver Clock Recovery

Figure 3:
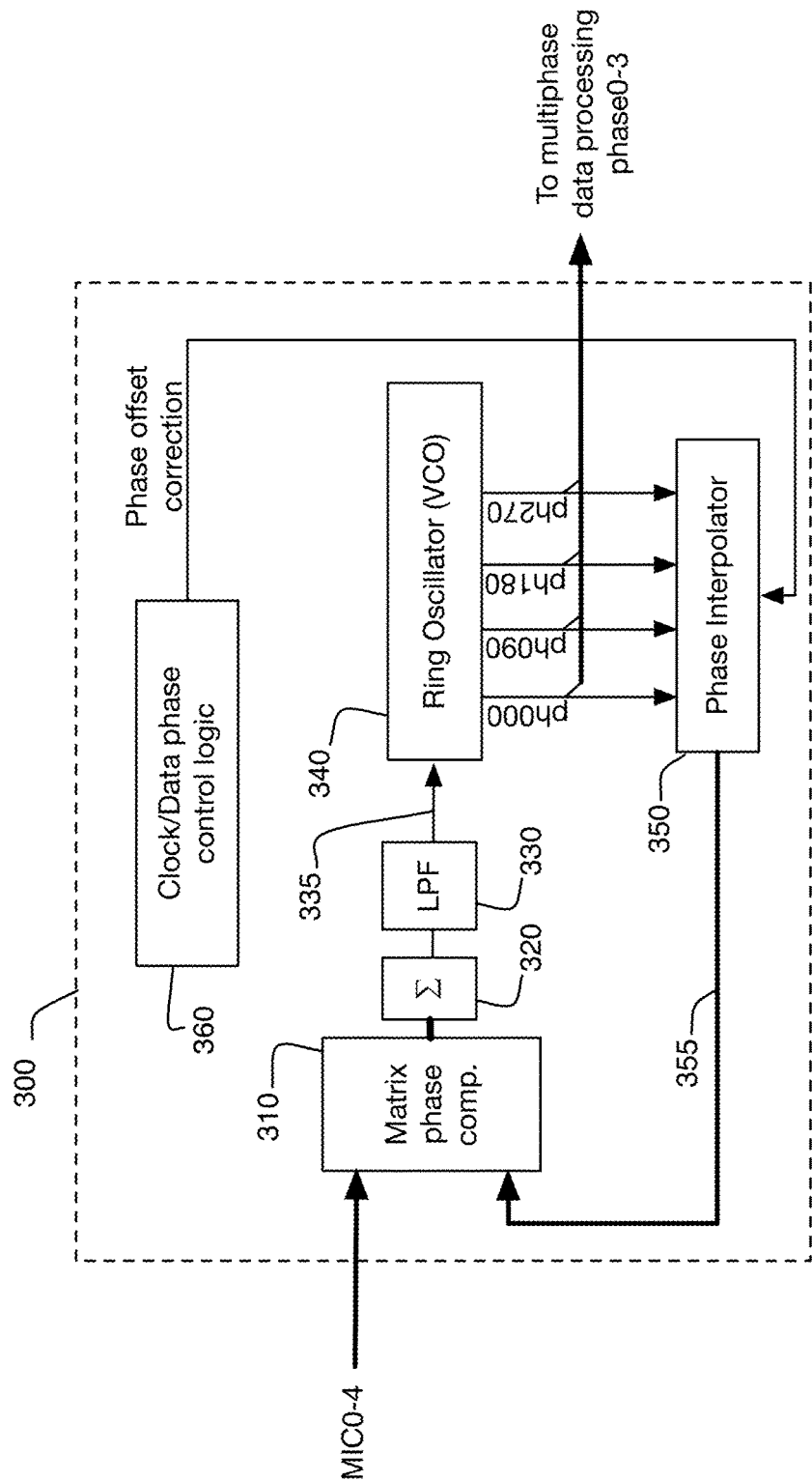
FIG. 3 is a block diagram detailing one embodiment of the clock recovery circuit used by the receiver of FIG. 2.

The example receiver utilizes a PLL embodiment as shown in FIG. 3. This PLL accepts the received data signals MIC0-MIC4, transitions of which act as the reference to which the PLL clocks will be phased locked. A Matrix Phase Comparator 310 as described in [Tajalli IV] compares these reference data transitions to internal clocks derived from the VCO, producing a set of phase error results which are in turn summed 320 and low pass filtered 330 to provide an Error value 335 which subsequently corrects the operating frequency of Ring Oscillator VCO 340. In some embodiments, the outputs of Phase Comparator 310 are digital waveforms requiring conversion to an analog error signal, either through implicit or explicit digital to analog conversion, or by use of an interface element such as a charge pump. Some embodiments may combine such conversion with all or part of the low pass filtering operation, as one example offered without limitation, by the digital filtering behavior shown by the switching action of a charge pump directed by digital control signals generating an analog signal output.

In one embodiment, ring oscillator 340, including a sequence of identical gates in a closed loop, is used as the internal Voltage Controlled Oscillator (VCO) timing source for the PLL. The VCO frequency is varied by analog adjustment of at least one of gate propagation delay, intergate rise and fall time, and gate switching threshold within the ring oscillator. This may be implemented via switched capacitor banks, where a digital control signal is applied to selective place capacitive elements in parallel and/or series combinations to alter an RC time constant, as one non-limiting example. Still further, a current source that drives a gate of the ring oscillator may be increased or decreased to alter the output switching rise-time/fall-time, and thereby adjust the effective delay. Outputs taken at equal intervals (i.e. separated by equal numbers of ring oscillator gates) along the sequence of gates comprising the ring oscillator provide the four data phase sampling clocks, herein identified as the 0, 90, 180, and 270 degree clocks.

In one embodiment, the ring oscillator is composed of eight identical sets of logic gates (e.g., a set of inverter circuits), thus the phase difference from one such set to the next is 45 degrees. In this embodiment, the 0, 90, 180, and 270 degree outputs may be obtained, as examples, from the second, fourth, sixth, and eighth outputs. As these clocks are cyclical, the final tap may be considered as logically adjacent to the initial tap, a 0 degree and a 360 degree phase offset being equivalent. As many variations of such designs are known in the art, neither the number of elements in the ring oscillator nor the specific taps at which particular outputs are made should be construed as implying a limitation. As one example, the location of the 0 degree tap is arbitrary, as one familiar with the art will recognize that normal PLL behavior will phase align the ring oscillator with the external phase reference regardless of its initial phase. Similarly, equivalent designs may be obtained in which the output clock phases do not have square wave duty cycles; as one example being produced by the action of AND or OR gates with inputs from different tap locations. In the example receiver, it is desired that the VCO operate at a multiple of the received reference clock frequency, thus Frequency Divider 350 divides the VCO outputs by a comparable amount prior to the Phase Detector. In one embodiment, binary (factor of two) dividers are incorporated at 350 to obtain the correct sampling clock rate. In another embodiment, no divider is utilized and the VCO outputs are presented to the phase interpolator directly.

Each of the four phases of sampling clocks is appropriately timed to sample received data for one of the four parallel processing phases. In particular, internal clock ph000 is aligned to optimally trigger data samplers in the phase0 phase of processing, clock ph090 in phase1, clock ph180 in phase2, and clock ph270 in phase3.

To allow the overall phase of the locked PLL signals to be offset from the reference clock input phase, the local clock outputs presented to the phase comparator may be modified by phase interpolator 350, the output phase of which is controllably intermediate between its input clock phases. Thus, the PLL may lock with its fixed phase relationship, while the internal clock signals obtained from ring oscillator 340 will be offset from that fixed phase by the phase delay amount introduced by phase interpolator 350, as controlled by signal Phase offset correction. Phase interpolators are known in the art, examples being provided by [Buchwald I] and [Tajalli II].

In one embodiment, phase interpolator 360 receives multiple clock phases from the ring oscillator 340 having 90 degree phase differences. Said phase interpolator may be controlled to select two adjacent clock input phases and then to interpolate between them so as to produce an output at a chosen phase offset between those selected two values. For purposes of description, it may be assumed that a phase detector design is used which drives the PLL to lock with a zero phase differential between the two phase detector inputs. Thus, continuing the example, applying the 0 and 90 degree clock phases as inputs to the phase interpolator allows adjustment such that the PLL leads the reference clock input by between 0 and 90 degrees.

It will be apparent that equivalent results with comparable phase offsets may be obtained using other pairs of degree clocks and/or other phase detector designs, which as previously described may lock with different phase differentials than that of the present example. Thus neither the particular phase clocks chosen nor the particular phase detector design described herein are limiting.

In the known art, [Nandwana] describes a Fractional-N clock multiplying PLL in which a single reference clock is phase compared to two local clocks derived using different integer divisor ratios, with interpolation between the two phase error results dynamically chosen to cancel the phase quantization error.

Data-Driven Phase Comparator

Considering the multiple data inputs being monitored by Matrix Phase Comparator 310, several operational considerations are apparent. First, as any received data bit may remain in either the "1" or "0" state in consecutive unit intervals, only data transitions between those states are relevant to PLL phase. In particular, between any two consecutive unit intervals a transition may or may not occur in any given data bit; indeed, no transition may occur on any data bit in a given clock interval. If a transition does occur, the matrix phase comparator may utilize the timing of that transition to update the PLL clock phase, while if no transition occurs, the PLL clock should be allowed to continue unchanged. If two or more data lines transition in the same clock interval, the timing errors derived from each such transition may be summed, which is consistent with the previously-described matrix phase comparator behavior.

Figure 5:
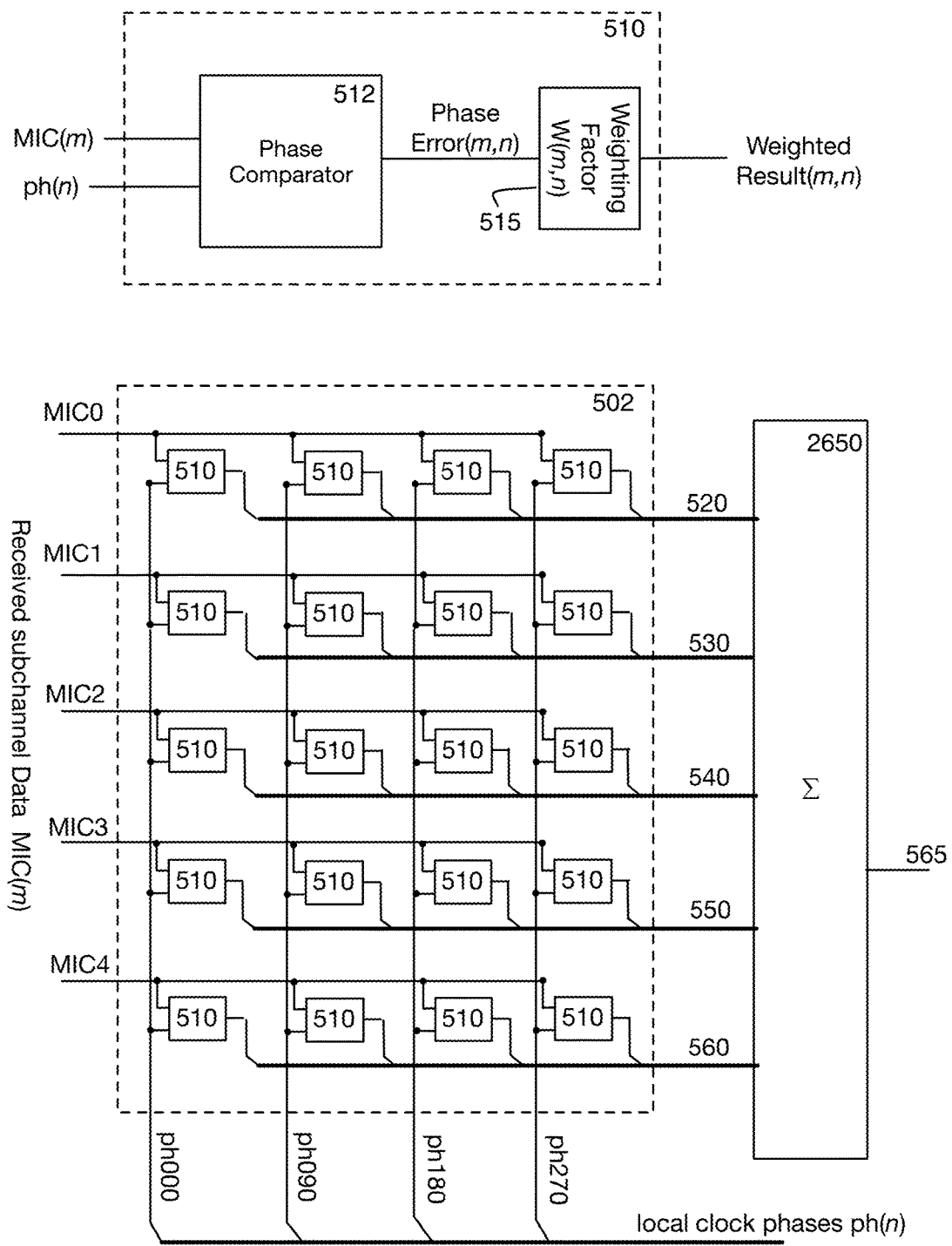
FIG. 5 is a block diagram of a matrix phase comparator operating on detected data signals, in accordance with some embodiments.
Figure 7:
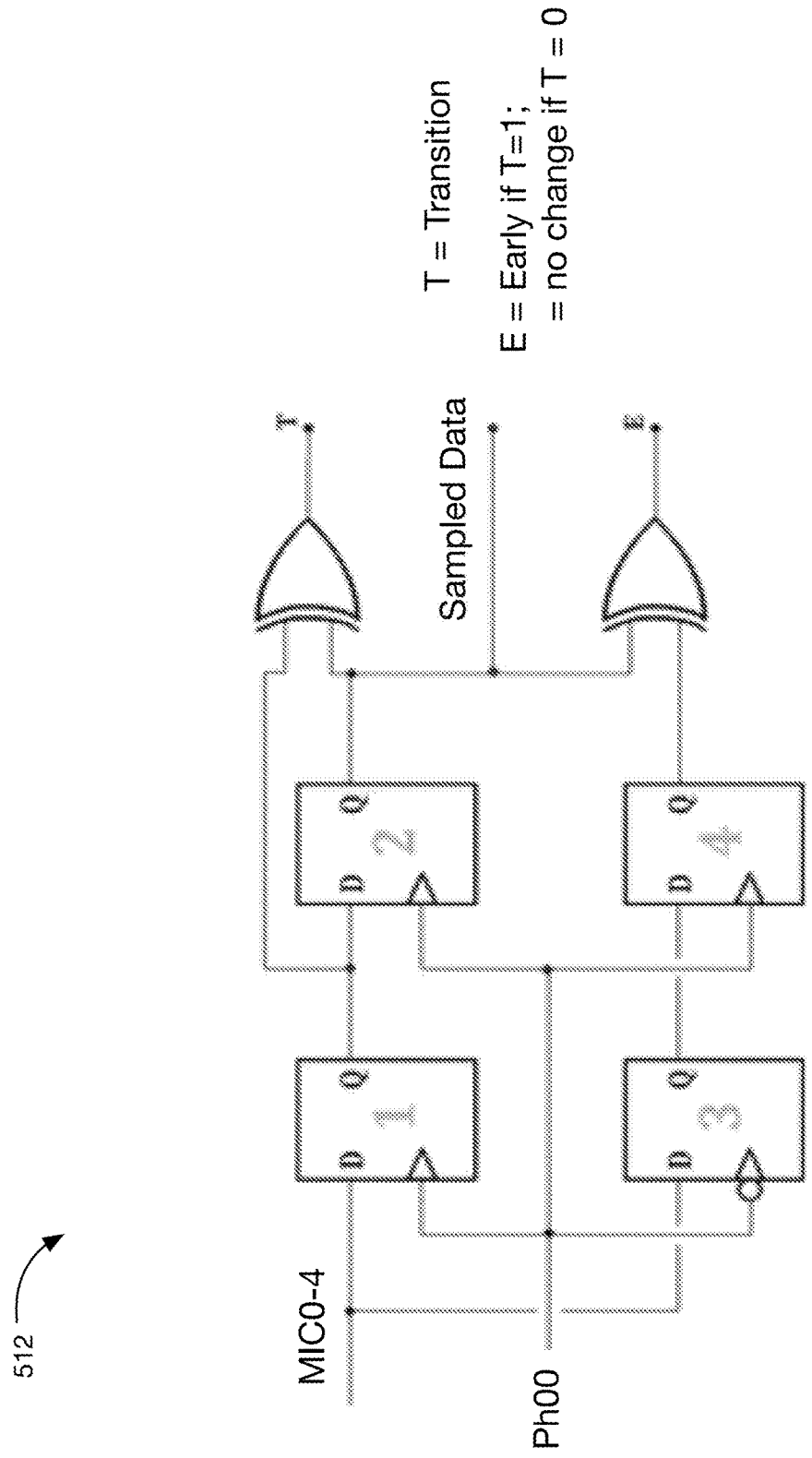
FIG. 7 is a block diagram of an edge-triggered bang-bang phase detector.
Figure 8:
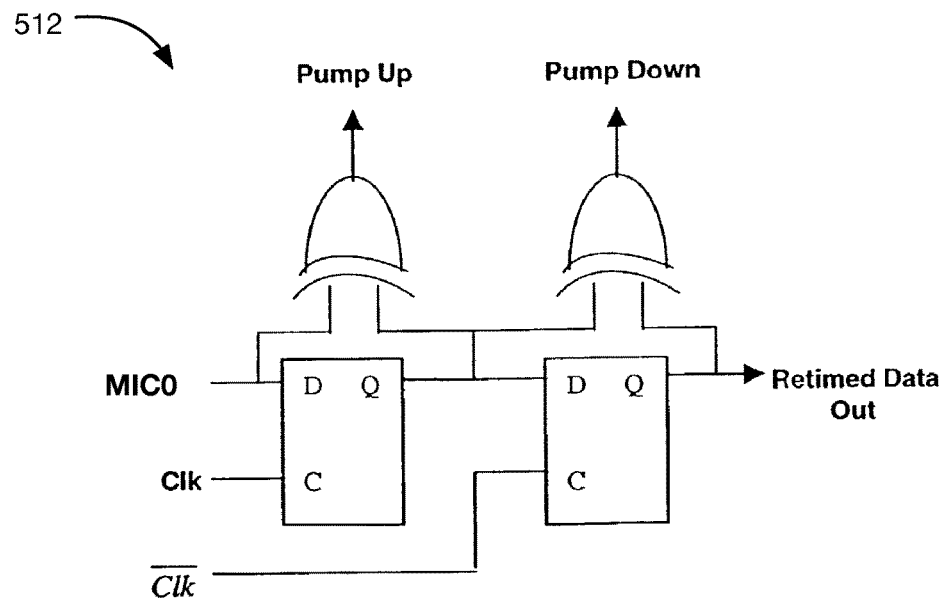
FIG. 8 is a block diagram of a linear edge-triggered phase detector.
Figure 9:
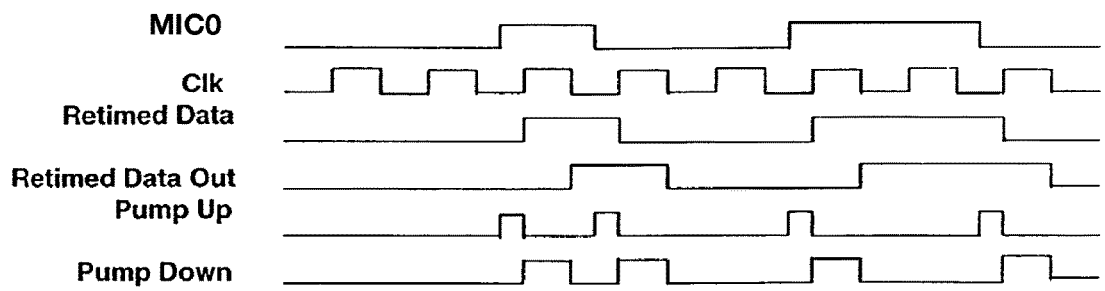
FIG. 9 is a wave-form associated with the linear edge-triggered phase detector of FIG. 30.

This behavior suggests that a state-machine phase detector may be a suitable candidate for the phase comparison elements of the comparison matrix, as such designs may be configured to respond only to signal transitions rather than signal level, and may be configured to output a "no change" result in the absence of a signal transition. In some embodiments, the partial phase comparators 512 shown in FIG. 5 may take the form of edge-triggered bang-bang detectors configured to generate partial phase-error signals in response to determining a transition occurred. A block diagram of an exemplary edge-triggered bang-bang phase detector is shown in FIG. 7. In some embodiments, the partial phase comparators may take the form of linear edge-triggered phase detectors to generate partial phase-error signals in response to determining a transition occurred. A block diagram of a linear edge-triggered phase detector is illustrated in FIG. 8, and a corresponding waveform is shown in FIG. 9.

Another embodiment may incorporate data signal transition detectors, one example including an XOR gate comparing a data signal with a slightly time delayed copy of the same data signal, for example after passing through a logic buffer gate. Such an embodiment will output a logical pulse at each transition, and the edge of such pulse may be phase compared to a PLL clock edge, using any phase detector as previously described. An advanced embodiment may further incorporate a gating or time windowing function in the partial phase comparators, to produce a "no change" error result from any phase detector not receiving a data signal transition in a given time interval.

In some embodiments, the partial phase-error signals are analog signals formed using respective charge pump circuits. In such embodiments, the method further includes filtering the composite phase-error signal.

In some embodiments, the method further includes introducing, for a given partial phase comparator, a sub-channel specific delay into the corresponding phase of the local oscillator signal, the sub-channel specific delay associated with the data signal received at the given partial phase comparator.

In some embodiments, the comparison of the corresponding phase of the local oscillator signal and the corresponding data signal is formed using a linear edge-triggered phase detector. Alternatively, the comparison of the corresponding phase of the local oscillator signal and the corresponding data signal may be formed using an edge-triggered bang-bang phase detector.

In some embodiments, the method further includes applying a weight to the partial phase-error signal. In some embodiments, the plurality of data signals have a collective transition density above a predetermined threshold. In some embodiments, the method further includes outputting a no-change result in response to determining no transition occurred. In such embodiments, outputting the no-change result includes setting the partial phase comparator in a high-impedance state.

Multi-Modal Data-Driven Clock Recovery Circuit

Figure 10:
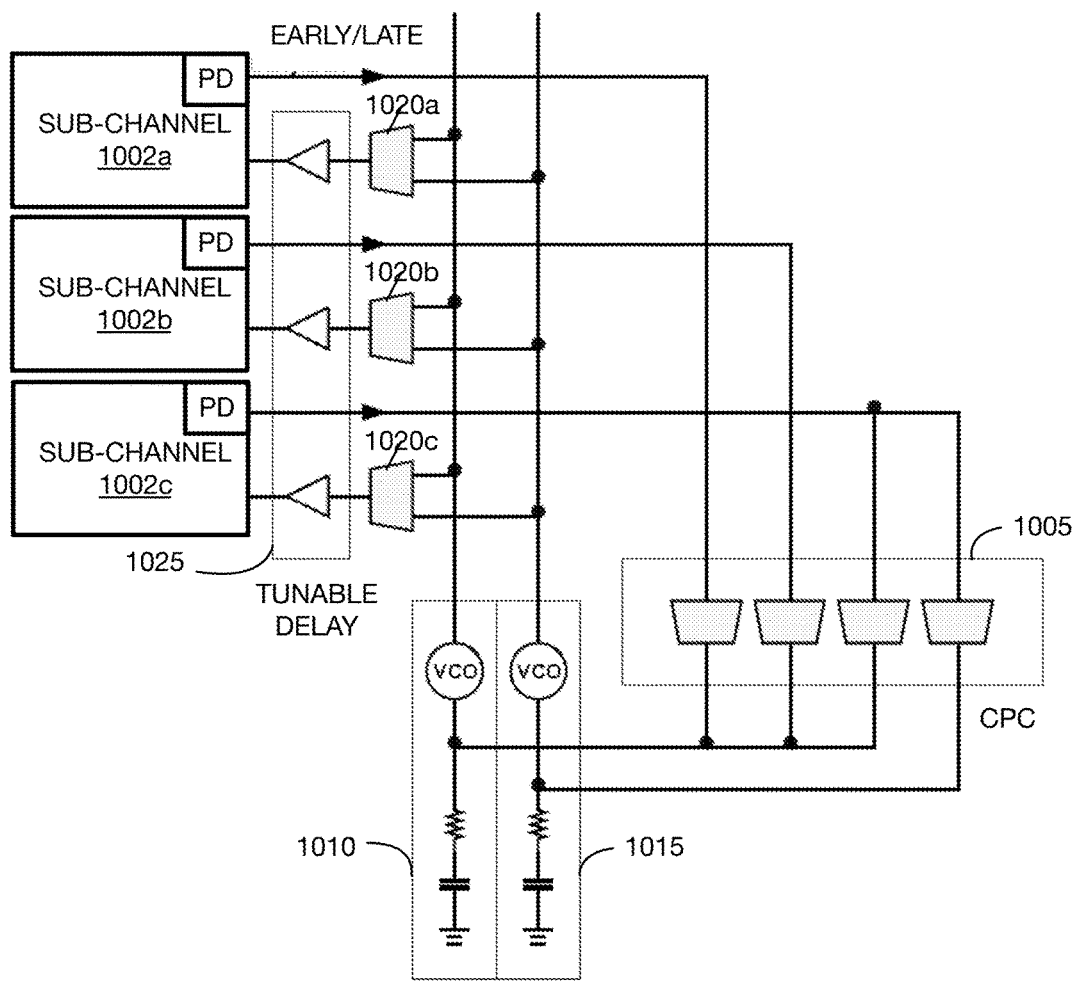
FIG. 10 is a block diagram of a multi-modal data-driven clock recovery circuit, in accordance with some embodiments.

In some embodiments, a data-driven clock recovery circuit may be configurable to operate in various modes, including a legacy mode. FIG. 10 illustrates an exemplary multi-modal data-driven clock recovery circuit, in accordance with some embodiments. As shown, the multi-modal data-driven clock recovery circuit includes a plurality of sub-channels 1002a/1002b/1002c, which may take the form of MICs as shown in FIG. 33, and may or may not also have a multi-phase receiver configuration such as shown in FIG. 25. Further, each sub-channel may include a data-driven phase detector (PD) element configured to generate a partial phase-error signal representing an early/late indication with respect to local oscillator signals provided by VCO circuits 1010 and/or 1015.

Figure 11:
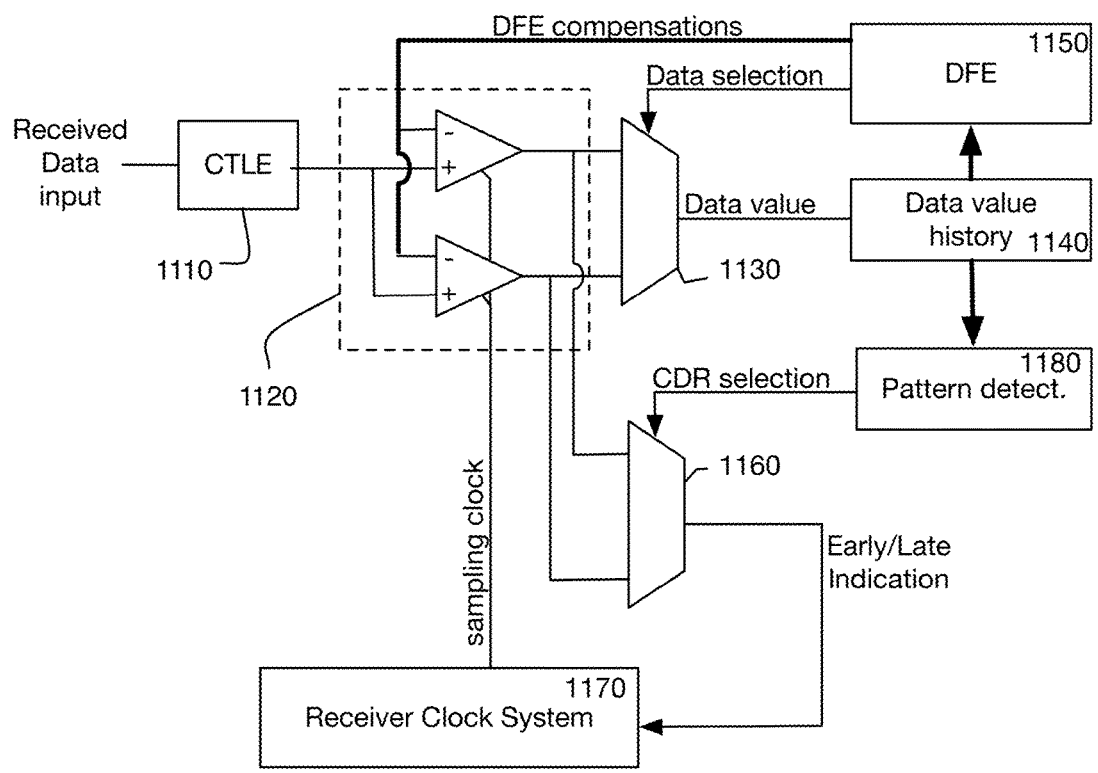
FIG. 11 is a block diagram of a receiver utilizing Decision Feedback Equalization to detect one sub-channel of a vector signaling code, and concurrently obtain an Early/Late Indication to correct the phase of the Receiver Clock System.

In particular, such a data-driven PD may be implemented as shown in FIG. 11, where two separate slicer elements 1120 are used to measure the output of the MIC. Note that each slicer uses a DFE-based offset voltage, where one uses the positive DFE offset, and the other uses a negative DFE offset, both of which are applied over the DFE compensations connections. (That is, one such DFE offset is associated with a speculative or "unrolled" DFE correction factor assuming the previous data bit was a one, and the other such DFE offset is associated with a speculative or "unrolled" DFE correction factor assuming the previous data bit was a zero.) In this way, once a data decision for a prior bit that was conveyed on the subchannel has been made by DFE unit 1150, that decision may be used to select one slicer output as a valid data signal having had an appropriate DFE compensation applied to it (by via mux 1130), while the other slicer (offset in the opposite amplitude direction) provides a useful early/late determination and is selected by mux 1160 as an early/late detection. Charge pump circuits 1005 may receive the early/late indications and provide a composite phase-error signal to provide to VCO 1010, which may include a loop filter illustrated by the series-connected resistor and capacitor. Note that in the embodiment shown in FIG. 10, the VCO loop control signal is generated in the analog signal domain and thus provides a loop bandwidth that is generally higher than loop control based solely on digital error filtering and integration/accumulation.

In a first mode of operation, the circuit may utilize all three sub-channels 1002a/1002b/1002c. The number of sub-channels is shown as three purely for illustrative purposes, and is not considered limiting, as higher orders of orthogonal ensemble non-return-to-zero (ENRZ) signaling may be used. In some embodiments, each sub-channel may include a MIC. FIG. 33 illustrates an exemplary configuration of a network of three MICs, in accordance with some embodiments. The network of MICs shown in FIG. 33 may be utilized in an ENRZ coding scheme. As shown, the three MICs are connected to a multi-wire bus having four wires, w0-w3. The output of each MIC represents a linear combination of codeword symbols received on the four wires. For purposes of clock recovery, data signal transitions are compared via phase detectors to a phase of a local oscillator signal provided by VCO 1010. The partial phase-error signals formed by individual charge pump circuits 1005 operating on the early/late indications are summed together to generate a composite phase-error signal and provided to VCO 1010 to make phase/frequency adjustments to VCO 1010. As shown in FIG. 10, the circuit may include tunable delay elements 1025 to account for sub-channel specific skew, as described above. Further, in the case that one or more sub-channels do not have data transitions, the corresponding charge pump output may be set in a high-impedance state or otherwise output a "no-change" indication.

In a legacy mode of operation, sub-channel 1002b may be switched off, and the circuit may be operated in a non-return-to-zero (NRZ) mode of operation, with sub-channels 1002a and 1002c each receiving a differential data signal over a respective pair of wires of the four-wires bus. In such an embodiment, the MIC of sub-channel 1002a may be connected to wires w0/w1 while wires w2/w3 are disconnected, while the MIC of sub-channel 1002c may be connected to wires w2/w3 with wires w0/w1 being disconnected. The output of sub-channel 1002c may be directed to adjust a second VCO 1015 via the right-most charge pump circuit, which may have an independent frequency and/or phase relationship with respect to VCO 1010. Selection element 1020c directs the phase provided by VCO 1015 to sub-channel 1002c to generate the early-late indication associated with sub-channel 1002c. Selection elements 1020a and 1020b are shown for illustrative purposes to illustrate symmetry, however it should be noted that selection elements 1020a and 1020b may be omitted in some embodiments, as sub-channels 1002a and 1002b are, in most embodiments, only connected to VCO 1010 (e.g., as shown in FIG. 10). In some embodiments, selection elements 1020a and 1020b may be included for loading purposes and to keep the circuitry consistent across each sub-channel. In such embodiments, the input to selection elements 1020a and 1020b connected to VCO 1015 may alternatively be tied to VDD or ground, or disconnected. It should be noted that the combination of sub-channels operating in legacy mode may vary, and the configuration shown in FIG. 10 illustrates only one possible configuration. In some embodiments, similar operations may be performed using a different number of sub-channels, such as the embodiment utilizing five sub-channels connected to six wires shown in FIG. 2.

In a further embodiment, configurable delay elements may be introduced between receiver clock system 1170 and each subchannel's samplers 1120, to allow incremental correction of timing variations among the multiple subchannels. Using the previous three subchannel system as an example offered without implying limitation, it may be observed that the signals received on subchannel 2 transition later than those of subchannels 1 and 3, thus the early/late indications from subchannel 2 indicate an "early" clock, even though subchannels 1 and 3 do not. In such a situation, the delay element associated with subchannel 2 may be configured to introduce a slight delay, moving its sampling time later relative to the overall clock timing. In at least one embodiment, individual clock source selections may be made for the subchannel samplers associated with data and clock edge detection, and with auxillary functions such as gathering statistical eye graph data and calibration. In such an embodiment, clock source selections include at least the unmodified clock provided by the Receiver Clock System, the incrementally delayed clock provided by the configurable delay element, and may also include a separately adjustable clock used for statistical eye graph sampling.

Obtaining Eye Diagram Measurements

The value of such "eye diagram" measurements is well understood in the art, providing an easily-understood presentation of multiple receiver characteristics, including receive signal amplitude margin, timing margin, and a rough determination of error rate. Other characteristics, including bandwidth, equalization, system gain, etc. may also be inferred. Such data may suggest or initiate system adjustments or controls, including transmit power adjustment, receiver gain adjustment, baud rate adjustment, and receive equalization adjustment.

Figure 6:
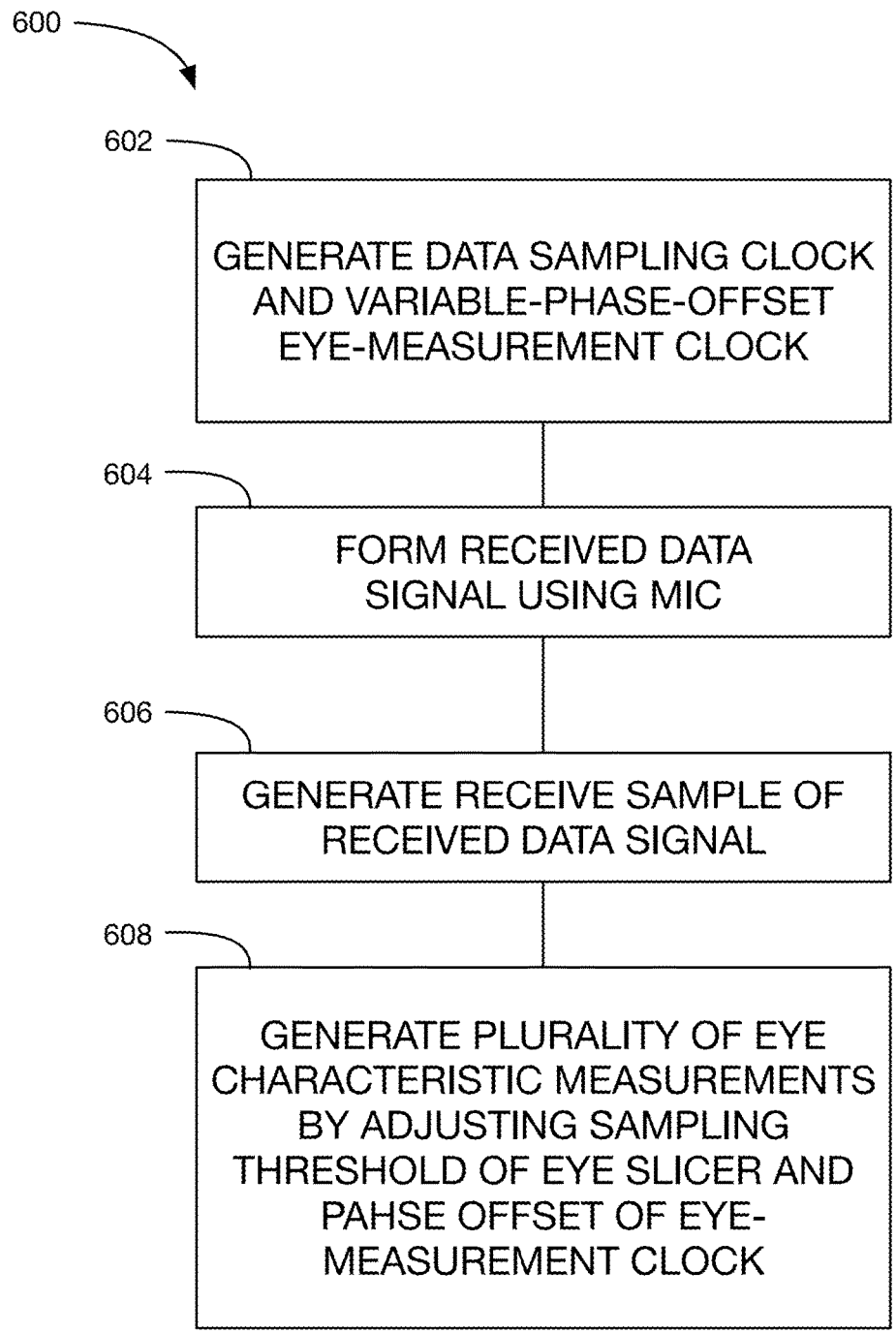
FIG. 6 is a flowchart of a method, in accordance with some embodiments.

FIG. 6 is a flowchart of a method 600, in accordance with some embodiments. As shown, method 600 includes generating 602, with a local oscillator and an adjustable phase interpolator, a data sampling clock and a variable-phase-offset eye measurement clock, forming 604 a received data signal using a multi-input-comparator (MIC), generating 606 a receive sample of the received data signal using a data slicer and the data sampling clock, and generating a plurality of eye characteristic measurements using at least one eye slicer and the variable-phase-offset eye measurement clock, by adjusting a sampling threshold of an eye slicer and a phase offset of the eye-measurement clock.

In some embodiments, at least one eye slicer comprises a first eye slicer having a positive threshold offset, and a second eye slicer having a negative threshold offset. In some embodiments, the data slicer is a DFE-compensated slicer that includes a DFE offset voltage configured to adjust the data slicer threshold to obtain the receive sample.

In some embodiments, the method further includes simultaneously obtaining a data-sampling phase error measurement using a second DFE-compensated slicer having a second DFE offset voltage. In such embodiments, the first and second DFE-compensated slicers may utilize slicing thresholds that are offset with a positive DFE offset and a negative DFE offset, respectively.

In some embodiments, the method includes generating the receive sample using an integrate and hold circuit.

In some embodiments, the method includes generating a data sample and a data phase error signal using the data slicer. In such embodiments, the data phase error signal is processed by a charge pump circuit to generate a local oscillator control signal for the local oscillator.

In some embodiments, the plurality of eye characteristic measurements are used to perform at least one action from the group consisting of: a transmit power adjustment, a receiver gain adjustment, a baud rate adjustment, and a receive equalization adjustment.

In some embodiments, one of the data-sampling clock and the variable-phase-offset eye-measurement clock is generated by the local oscillator, and wherein the other of the data-sampling clock and the variable-phase-offset eye-measurement clock is generated using the phase interpolator. In such embodiments, the data sampling clock and variable-phase-offset eye-measurement clock may be selectively provided to the data slicer and the at least one eye slicer using a selection circuit.

In some embodiments, generating the data-sampling clock includes using the local oscillator, and the variable-phase-offset eye-measurement clock is generated using the adjustable phase interpolator. In alternative embodiments, the data-sampling clock is generated using the adjustable phase interpolator, and the variable-phase-offset eye-measurement clock is generated using the local oscillator.

Figure 4:
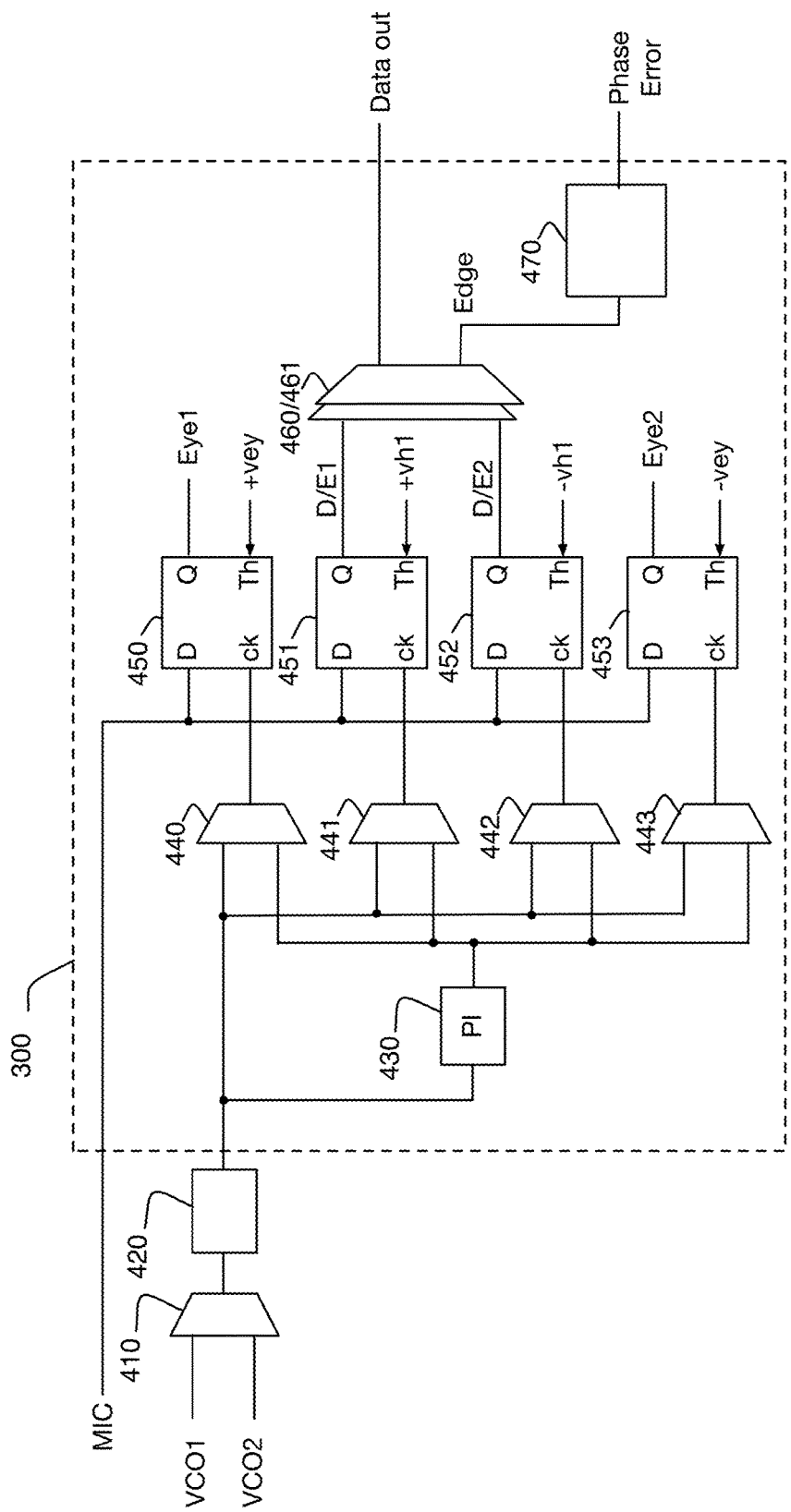
FIG. 4 details one embodiment of a receive processing phase.

FIG. 4 illustrates the above components combined in one embodiment of a processing phase 300, as previously described in relation to FIG. 3. A sampling clock produced by VCO1 or VCO2 may be selected by multiplexer 410, and optionally delayed by adjustable delay buffer 420. The previously-described data sampling function is shown in this embodiment as four clocked samplers (which may also be referred to herein as slicers) 450, 451, 452, 453. In one embodiment, the samplers are clocked analog integrate-and-hold elements, although no limitation is implied as known art sample-and-hold, track-and-hold, clocked comparator, and other comparable circuits are equally applicable.

Each sampler accepts an input signal at D, and compares the state of D relative to threshold Th at the time determined by clock ck with the result available at output Q. Samplers 451 and 452 are provided with speculative DFE correction values +vh1 and −vh1, corresponding to DFE correction values of previous data values "high" and "low" respectively. Thus, as previously described, one of results D/E1 and D/E2 will be chosen by multiplexer 460 as the received data value, with the other result (a potential edge transition) directed by multiplexer 461 to Phase Comparator/Charge Pump 470 to produce a Phase Error signal for adjusting the PLL. Such a phase error signal may correspond to the Early/Late signals shown in FIG. 10.

A comparable multiplexer to that illustrated as 460 selects between signals Eye1 and Eye2 based on the previous received data value, to obtain a measurement result for generation of a statistical eye diagram corresponding to amplitude thresholds +vey, −vey and the timing offset provided by adjustable delay buffer 430. As shown, amplitude thresholds +vey, −vey may be adjusted as the variable-phase-offset clock is rotated throughout the unit interval to determine values for +vey, −vey corresponding to the top and bottom of the eye at various times in the unit interval. Using the determined values for each point in the unit interval, a 2-dimensional diagram of an eye may be generated.

In an alternative embodiment, phase interpolators may be used instead of adjustable delay buffers. Thus, as one example, 430 is a phase interpolator producing a variable-phase-offset clock which may be provided to samplers 450 and 453 for eye measurement. As shown in FIG. 4, multiplexors 441/442 may be configurable to direct the data-sampling clock to data samplers 451/452, while multiplexors 440/443 may be configurable to direct the variable-phase-offset eye-measurement clock to eye samplers 450/453. In some embodiments, the multiplexors 441/442 may direct the selected local oscillator signal to the data samplers 451/452, while conversely the multiplexors 440/443 are configured to direct the output of the phase interpolator 430 to eye samplers 450/453. Alternatively, multiplexors 441/442 may direct the output of phase interpolator 430 to the data samplers 451/452, while conversely the multiplexors 440/443 are configured to direct the selected local oscillator signal to eye samplers 450/453. In some embodiments, phase interpolator 430 may have an associated delay. In such embodiments, the phase interpolator delay may be measured and then accounted for in subsequent operation. In one embodiment, the local oscillator signal may be applied to the data samplers 451/452 and the phase interpolator may adjust the local oscillator signal until the edge of the eye is detected. This provides an interpolator code that represents an offset to the edge of the eye, which, together with the interpolator error is the full offset. Then, the roles of the clock signal may be switched via the multiplexors such that the phase interpolator is rotated until the edge of the eye is detected is by samplers 450/453. Note that as this rotation is occurring, the error signals generated by samplers 451/452 keep the combined local oscillator and phase interpolator output locked to the middle of the eye. The resulting interpolator code may be combined with the first interpolator code to determine the interpolator delay.

As previously described, the received signal MIC is produced by at least one multi-input comparator (MIC) connected to a plurality of wires of a multiwire bus, the MIC configured to form a received data signal. A clock generator PLL, including at least a local oscillator and an adjustable phase interpolator 430 is configured to generate a data-sampling clock and a variable-phase-offset eye-measurement clock. At least one data slicer is configured to receive the data sampling clock, and configured to generate a receive sample of the received data signal, and at least one eye slicer is configured to receive the variable-phase-offset eye-measurement clock, and configured to generate a plurality of eye characteristic measurements. In some embodiments, multiplexors 441 and 442 are configured to provide one of the local oscillator signal VCO1/VCO2 and the signal generated by the phase interpolator 430 to the data slicers 451 and 452, respectively. In such embodiments, multiplexors 440 and 443 may be configured to provide the other of the local oscillator signal and the phase interpolator signal to eye slicers 450 and 453, respectively. In an embodiment utilizing Decision Feedback Equalization (DFE), the eye slicer may include a first eye slicer having a positive threshold offset, and a second eye slicer having a negative threshold offset. Such offsets may be adjusted in order to make eye characteristic measurements to determine a vertical opening of the eye. For example, while the variable-phase-offset eye-measurement clock is rotated forwards and backwards within a given unit interval, threshold offsets ±vey may be adjusted higher and lower to determine the eye height at various locations in the unit interval. Similarly, the data slicer may be a DFE-compensated slicer that includes a DFE offset voltage configured to adjust the data slicer threshold to obtain the receive sample, and may further include a second DFE-compensated slicer having a second DFE offset voltage to simultaneously obtain a data-sampling phase error measurement. In such embodiments, the first and second DFE-compensated slicers may utilize slicing thresholds that are offset with a positive DFE offset and a negative DFE offset, respectively. According to a data history such as data history 1140 shown in FIG. 11, the output of the DFE-compensated slicer utilizing the correct DFE offset may be used as a data sample. Further, the output of the other DFE-compensated slicer may correspond to a phase-error signal, for example if a known pattern was detected using a pattern detector such as pattern detector 1180 shown in FIG. 11

The invention claimed is:

1. A method comprising:
   forming a received data signal using a multi-input comparator detecting a respective sub-channel of a plurality of mutually orthogonal sub-channels carried by a multi-wire bus;
   generating, with a local oscillator and an adjustable phase interpolator, a data-sampling clock and a variable-phase-offset eye-measurement clock having an applied sub-channel specific delay associated with the respective sub-channel of the plurality of mutually orthogonal sub-channels;
   generating, using a data slicer and the data sampling clock, a receive sample of the received data signal; and
   generating, using at least one eye slicer and the variable-phase-offset eye-measurement clock, a plurality of eye characteristic measurements by adjusting a sampling threshold of the at least one eye slicer and a phase offset of the variable-phase-offset eye-measurement clock.

2. The method of claim 1, further comprising adjusting a data slicer threshold of the data slicer to obtain the receive sample using a first decision feedback equalization (DFE)-compensated slicer that includes a DFE offset voltage.

3. The method of claim 2, further comprising simultaneously obtaining a data-sampling phase error measurement using a second DFE-compensated slicer having a second DFE offset voltage.

4. The method of claim 3, wherein the first and second DFE-compensated slicers utilize slicing thresholds that are offset with a positive DFE offset and a negative DFE offset, respectively.

5. The method of claim 1, further comprising generating the receive sample using an integrate and hold circuit.

6. The method of claim 1, wherein the data slicer generates a data sample and a data phase error signal.

7. The method of claim 6, further comprising processing the data phase error signal using a charge pump circuit to generate a local oscillator control signal for the local oscillator.

8. The method of claim 1, wherein one of the data-sampling clock and the variable-phase-offset eye-measurement clock is generated by the local oscillator, and wherein the other of the data-sampling clock and the variable-phase-offset eye-measurement clock is generated using the phase interpolator.

9. The method of claim 1, further comprising determining a phase interpolator delay value associated with the phase interpolator by:
   selecting an output of the phase interpolator as the variable-phase-offset eye-measurement clock and obtaining a first phase interpolator code that aligns the output of the phase interpolator to an edge of an eye;
   selecting an output of the local oscillator as the variable-phase-offset eye-measurement clock and obtaining a second phase interpolator code that aligns the output of the local oscillator to an edge of an eye; and
   comparing the first and second phase interpolator codes to determine the phase interpolator delay value.

10. The method of claim 9, wherein the variable-phase-offset eye-measurement clock and the data sampling clock are each selected via respective multiplexers receiving outputs of the phase interpolator and the local oscillator.

11. An apparatus comprising:
   at least one multi-input comparator (MIC) connected to a plurality of wires of a multi-wire bus, the MIC configured to form a received data signal corresponding to a detected sub-channel of a plurality of mutually orthogonal sub-channels carried on the plurality of wires of the multi-wire bus;
   a local oscillator and an adjustable phase interpolator configured to generate a data-sampling clock and a variable-phase-offset eye-measurement clock having an applied sub-channel specific delay associated with the respective sub-channel of the plurality of mutually orthogonal sub-channels;
   at least one data slicer configured to receive the data sampling clock, and configured to generate a receive sample of the received data signal; and
   at least one eye slicer configured to receive the variable-phase-offset eye-measurement clock, and configured to generate a plurality of eye characteristic measurements.

12. The apparatus of claim 11, wherein the at least one eye slicer comprises a first eye slicer having a positive threshold offset, and a second eye slicer having a negative threshold offset.

13. The apparatus of claim 11, further comprising first decision feedback equalization (DFE)-compensated slicer that includes a DFE offset voltage configured to adjust the data slicer threshold to obtain the receive sample.

14. The apparatus of claim 13, further comprising a second DFE-compensated slicer having a second DFE offset voltage configured to simultaneously obtain a data-sampling phase error measurement.

15. The apparatus of claim 14, wherein the first and second DFE-compensated slicers utilize slicing thresholds that are offset with a positive DFE offset and a negative DFE offset, respectively.

16. The apparatus of claim 11, further comprising an integrate and hold circuit configured to generate the receive sample.

17. The apparatus of claim 11, wherein the data slicer is configured to generate a data sample and a data phase error signal.

18. The apparatus of claim 17, further comprising a charge pump circuit configured to process the data phase error signal to generate a local oscillator control signal for the local oscillator.

19. The apparatus of claim 11, further comprising a tunable delay element configured to apply the sub-channel specific delay to the data sampling clock and the variable-phase-offset eye-measurement clock.

20. The apparatus of claim 11, wherein the phase interpolator is configured via a phase interpolator code, the phase interpolator code used in determining a phase interpolator delay value associated with the phase interpolator by:
selecting, via a plurality of multiplexers, an output of the phase interpolator as the variable-phase-offset eye-measurement clock and obtaining a first phase interpolator code that aligns the output of the phase interpolator to an edge of an eye;
selecting, via the plurality of multiplexers, an output of the local oscillator as the variable-phase-offset eye-measurement clock and obtaining a second phase interpolator code that aligns the output of the local oscillator to an edge of an eye; and
comparing the first and second phase interpolator codes to determine the phase interpolator delay value.

\* \* \* \* \*